(12) United States Patent
Takemura et al.

(10) Patent No.: US 6,538,945 B2
(45) Date of Patent: Mar. 25, 2003

(54) SENSE AMPLIFIERS HAVING REDUCED VTH DEVIATION

(75) Inventors: Riichiro Takemura, Tokyo (JP); Tsugio Takahashi, Hachioji (JP); Masayuki Nakamura, Ome (JP); Ryo Nagai, Mizuho (JP); Norikatsu Takaura, Kokubunji (JP); Tomonori Sekiguchi, Kokubunji (JP); Shinichiro Kimura, Kunitachi (JP)

(73) Assignees: Hitachi, Ltd., Tokyo (JP); NEC Corporation, Tokyo (JP)

( * ) Notice: Subject to any disclaimer, the term of this patent is extended or adjusted under 35 U.S.C. 154(b) by 0 days.

(21) Appl. No.: 10/050,561

(22) Filed: Jan. 18, 2002

(65) Prior Publication Data

US 2002/0122344 A1 Sep. 5, 2002

(30) Foreign Application Priority Data

Mar. 1, 2001 (JP) ........................................ 2001-056463

(51) Int. Cl.$^7$ ................................................ G11C 7/00
(52) U.S. Cl. ........................ 365/205; 365/207; 365/208
(58) Field of Search ................................ 365/205, 207, 365/206, 208

(56) References Cited

U.S. PATENT DOCUMENTS

| | | | | |
|---|---|---|---|---|
| 4,833,645 A | * | 5/1989 | Matsuda et al. ............. | 365/205 |
| 5,917,211 A | * | 6/1999 | Murata et al. ............... | 257/296 |
| 6,037,619 A | * | 3/2000 | Morizuka et al. ........... | 257/280 |

FOREIGN PATENT DOCUMENTS

| | | |
|---|---|---|
| JP | 8-167661 A | 6/1996 |
| JP | 2000-196017 A | 7/2000 |

OTHER PUBLICATIONS

"VLSI Memory Chip Design," Kiyoo Itoh, Springer Series in Advanced Microelectronics, pp. 223–230.
"Fundamental of Modern VLSI Devices," Cambridge University Press 1998, pp. 200–203.

* cited by examiner

*Primary Examiner*—Tan T. Nguyen
(74) *Attorney, Agent, or Firm*—Antonelli, Terry, Stout & Kraus, LLP.

(57) ABSTRACT

Providing a semiconductor device which lessen influence of the transistor threshold voltage deviation that is one of noise elements when the sense amplifiers are amplified, and which are capable of accurately sensing and amplifying micro signals having read from the memory cells in the sense amplifiers. In a DRAM chip, P$^+$-type gate PMOSs of P$^+$-type polysilicon gates each having a low impurity density of channel and N$^+$-type gate NMOSs of N$^+$-type polysilicon gates are used in a sense amplifier cross coupling section to further increase substrate voltages of the PMOSs and to decrease substrate voltages of the NMOS. For this reason, a deviation of threshold voltage caused by channel implantation is reduced, and a small signal generated on a data line at a read operation of a low-potential memory array is accurately sensed and amplified by a sense amplifier. In addition, the threshold voltages are increased by a substrate bias effect, and a leakage current in a sense amplifier data holding state is reduced.

20 Claims, 17 Drawing Sheets

SENSE AMPLIFIERS HAVING REDUCED VTH DEVIATION

BACKGROUND OF THE INVENTION

The present invention relates to a semiconductor device and, more particularly, to a technique which is effectively applied to constitution of a sense amplifier section or/and a differential amplifier section in the semiconductor device.

The list of reference documents which are referred to in the present invention is as follows. The reference documents will be indicated by document numbers.

(1) [Reference Document 1]: VLSI Memory Chip Design, Kiyoo Itoh, Springer Series in Advanced Microelectronics, pp. 223–230

(2) [Reference Document 2]: Fundamental of Modern VLSI Devices, Cambridge University Press 1998

(3) [Reference Document 3]: Japanese Patent Laid-Open No. 8-167661

(4) [Reference Document 4]: Japanese Patent Laid-Open No. 2000-196017

SUMMARY OF THE INVENTION

As a technique examined by the present inventors, the following technique has been thought about the configuration of the sense amplifier section in the semiconductor device. Although the following technique has not been a known technique, this technique is examined by the present inventors as the assumption of the present invention. The outline of the technique will be described with reference to the drawings. FIG. 16A shows a layout diagram of a transistor channel region and a sense amplifier in a DRAM chip examined by the present inventors. FIG. 16B shows a layout diagram of a sense amplifier cross coupling section serving as a main part of the sense amplifier. FIG. 16C shows a sectional view of the sense amplifier cross coupling section. FIG. 17 shows a circuit diagram of each part of the sense amplifier cross coupling section and common source lines.

In a DRAM (Dynamic Random Access Memory), in order to reduce the cost and simplify the processes thereof, $N^+$-type polysilicon has been used as each gate material of PMOS and NMOS transistors. In the DRAM, an impurity density of a channel region PINP(SA) of an NMOS transistor of a sense amplifier block SAB in a memory array MA is constant at a density of p(SA). Similarly, an impurity density of a channel region NINP(SA) of a PMOS transistor of a sense amplifier block SAB in a memory array MA is constant at a density of n(SA). Each of the densities is equal to an impurity density p(peri) of a channel region PINP(peri) of an NMOS transistor in a peripheral circuit peri and an impurity density n(peri) of a channel region NINP(peri) of a PMOS transistor in the peripheral circuit peri.

In addition, transistors of a sense amplifier cross coupling section CC comprise PMOS transistors (to be referred to $N^+$-type gate PMOS hereinafter) Qp0' and Qp1' of $N^+$-type polysilicon gates $N^+$poly each using an $N^+$-type polysilicon layer as a gate as shown in FIGS. 16B and 16C and FIG. 17, and NMOS transistors (to be referred to as $N^+$-type gate NMOS hereinafter) Qn0 and Qn1 of $N^+$-type polysilicon gates $N^+$poly each using an $N^+$-type polysilicon layer as a gate. Each transistor of the $N^+$-type gate PMOSs Qp0' and Qp1' has a buried channel structure and has such a problem that deviation of threshold voltage increases. Influence of threshold voltage deviation of a pair of transistors on the sense amplifier has been described in [Reference Document 1] in detail. Threshold voltage difference between a pair of MOSs and generated by deviation of the threshold voltage causes a read error since reducing an effective signal voltage in a sense amplifier operation. The threshold voltage deviation of this transistor is caused by deviation of process steps, layouts, or the like. In order to reduce this threshold voltage deviation, the configuration described above has used a transistor having a relatively large gate in length, or/and adopted patterns having fewer deviation in layouts.

As a result of consideration of the present inventor, the following has been apparent from the technique of the semiconductor devices described above. For example, as micro fabrication of semiconductor devices develops, a sufficient effect on reduction of the threshold voltage deviation has not been objected by the above-mentioned technique only. In FIG. 17 described above, each of the $N^+$-type gate PMOS Qp0' and Qp1' has a channel structure of a buried channel, and so the threshold voltage deviation thereof increases. In addition, since $N^+$-type gate NMOS Qn0 and Qn1 use $N^+$-type polysilicon layers as gates and comes to surface channels, it has smaller threshold voltage deviation than the $N^+$-type gate PMOS. However, even the transistors of the surface channels are required to reduce both memory array and layout size of the sense amplifier by micro fabrication, and so layouts each having fewer deviation and small area have been difficult to realize.

Further, there is threshold voltage deviation caused by a step of channel impurity implantation (to be referred to as channel implantation hereinafter) for adjusting each threshold voltage of transistors, so that total amounts of deviation come to about several tens mV to a hundred and several tens mV or more. This results in reduction in effective signals sensed actually by sense amplifiers, and in high probability of read errors of sense amplifiers, and in increase in the number of fail bits. In addition, in a highly integrated and large-capacity DRAM, a data line swing voltage is made lower and capacity of memory cells decreases due to structure thereof, so that the read out signal voltage from memory cell decreases. Therefore, in order to achieve stable operation thereof, it is essential that the threshold voltage deviation is reduced.

Thereupon, an object of the present invention is to reduce the difference between threshold voltages of sense amplifier transistors for decreasing signal voltages, and to provide sense amplifiers having reduced vth deviation, which lessen influence of the transistor threshold voltage deviation that is one of noise elements when the sense amplifiers are amplified, and which are capable of accurately sensing and amplifying micro signals having read from the memory cells in the sense amplifiers.

The above and other objects and novel features of the present invention will be apparent from the description of the present specification and the accompanying drawings.

Of inventions disclosed in this application, the outlines of typical ones will be described below.

According to the present invention, in order to reduce deviations of threshold voltages caused by an amount of channel impurity implantation of channel (to be referred to as an amount of channel implantation) for adjusting threshold voltages, the amount of channel implantation in the steps of fabricating transistors, and the deviations of threshold voltage are reduced, and a sense amplifier having a small threshold voltage difference therebetween is realized. In addition, if there is such a threshold voltage that a leakage current is worth consideration is generated, then a substrate bias voltage is used to compensate for decrease in threshold voltage, and a sense amplifier which has a small power consumption and which achieves a small deviation of threshold voltage is realized.

More specifically, a semiconductor device according to the present invention is one that comprises a plurality of memory cells arranged at intersecting points of a plurality of word lines and a plurality of data lines; a plurality of sense amplifiers provided so as to each correspond to said plurality of data lines and having a first MISFET pair of a first conductivity type which uses a cross-coupled P-type polysilicon layer as a gate electrode; and a decoder circuit having a second MISFET of said first conductivity type which uses a P-type polysilicon layer as a gate electrode and which selects any one of said memory cells, wherein an impurity density of channel of said first MISFET pair is lower than that of said second MISFET.

Further, another semiconductor device according to the present invention comprises a circuit that includes a first MISFET of a first conductivity type in which a substrate potential is used as a first potential and which uses a P-type polysilicon layer as a gate electrode, and a second MISFET of a second conductivity type in which a second potential is used as a substrate potential and which uses an N-type polysilicon layer as a gate electrode; a third and fourth MISFETs of said first conductivity type which use P-type polysilicon layers as gate electrodes and whose the gate electrodes are connected to any one of drain terminals thereof and whose source terminals are common to each other; a fifth MISFET of said second conductivity type which uses an N-type polysilicon layer as a gate electrode and the gate electrode of which a first signal is input into and a drain terminal of which is connected to a drain terminal of said third MISFET; and a sixth MISFET of said second conductivity type which use an N-type polysilicon layer as a gate electrode and the gate electrode of which a second signal is input into and a source terminal whose is commonly connected to said fifth MISFET, wherein each impurity density of channels of said fifth MISFET and said sixth MISFET is lower than that channel of the first MISFET, and wherein each substrate potential of said fifth MISFET and said sixth MISFET is lower than said second potential.

DESCRIPTION OF THE PREFERRED EMBODIMENTS

Figure 1A:
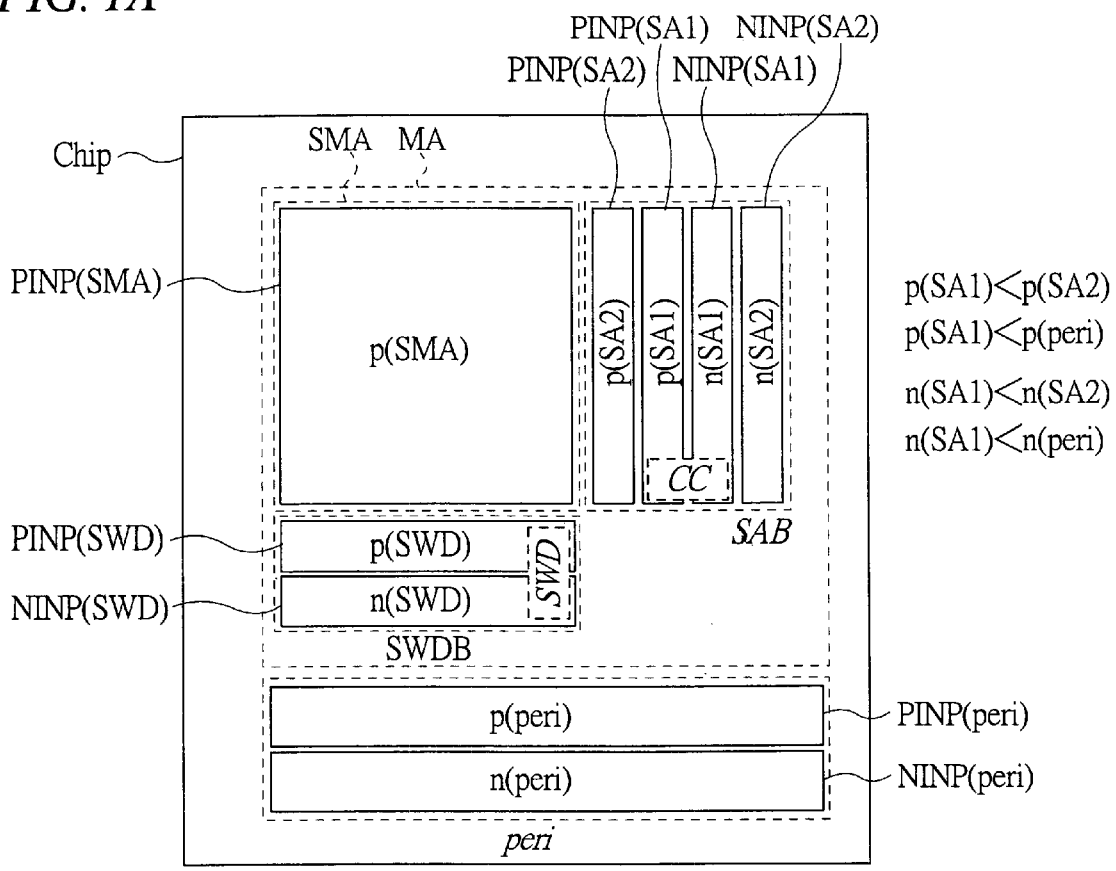
FIG. 1A is a layout diagram showing a transistor channel region and a sense amplifier of a DRAM to which the present invention is applied.

Embodiments of the present invention will be described below in detail with reference to the accompanying drawings. The same reference numerals in all the drawings for explaining the embodiments denote the same members, and repetition thereof will be omitted.

In a semiconductor device according to the present embodiments, circuit elements constituting respective blocks are formed on one semiconductor substrate such as a single crystal silicon substrate, by an integrated circuit technique such as a known CMOS transistor (complementary MOS transistor) or the like. As circuit symbols of MOSFETs (Metal Oxide Semiconductor Field Effect Transistors), a symbol without an arrow indicates an N-type MOSFET (NMOS) and a symbol with an arrow indicates a P-type MOSFET (PMOS) from which the N-type MISFET is distinguished. The MOSFET will be called a MOS hereinafter. The NMOS and PMOS surrounded by circles in circuit diagrams mean transistors having small implantation amounts of channel impurities (to be referred to as channel implantation amount hereinafter) for adjusting each threshold voltage. In addition, gate materials are an $N^+$-type polysilicon layer in the case of the NMOS and a $P^+$-type polysilicon layer in the case of the PMOS unless the drawings or/and the specification make particularly definition. Further, although the present invention adopts the MOSFET as an example, it also includes an insulating gate transistor MISFET (Metal Insulator Semiconductor Field Effect Transistor). Moreover, the present invention has the same effect even though a memory array is constituted by an open type data line arrangement or a folded data line arrangement. Therefore, the memory array is not limited to the data line arrangement. The case where the present invention adopts the folded data line arrangement will be described below.

(First Embodiment)

Figure 1B:
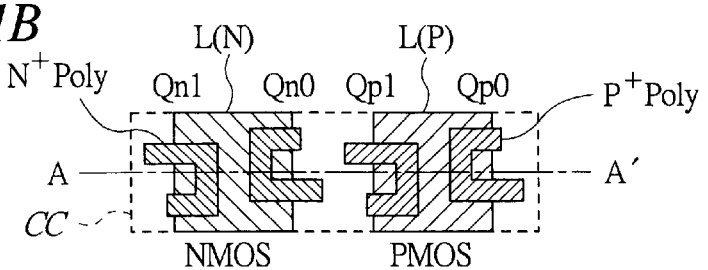
FIG. 1B is a layout diagram showing a sense amplifier cross coupling section.
Figure 1C:
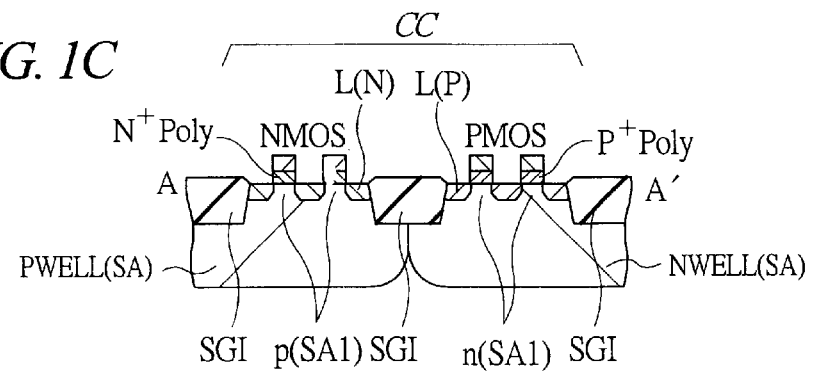
FIG. 1C is a cross-sectional view showing a sense amplifier cross coupling section.
Figure 2A:
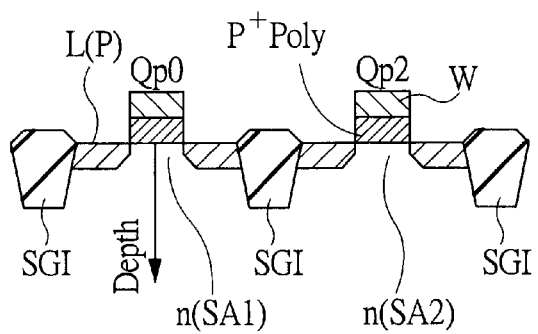
FIG. 2A is a cross-sectional view showing a PMOS transistor of a sense amplifier cross coupling section to which the present invention is applied and a PMOS transistor for a sense driver.
Figure 2B:
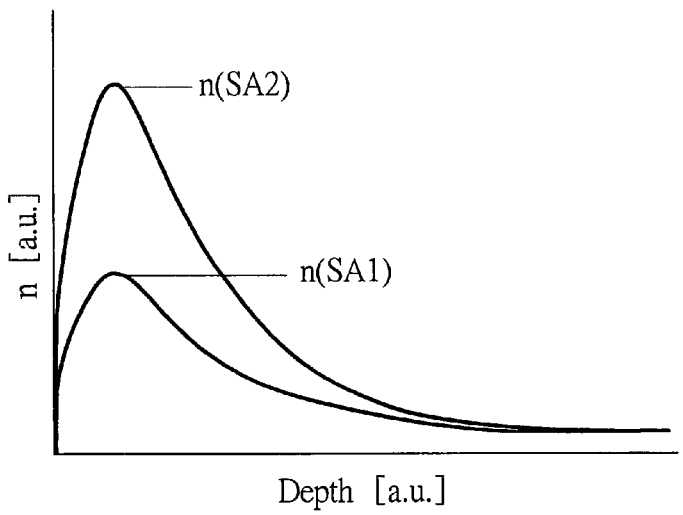
FIG. 2B shows distributions of channel impurities to a deepening direction of each substrate of PMOS transistors.
Figure 2C:
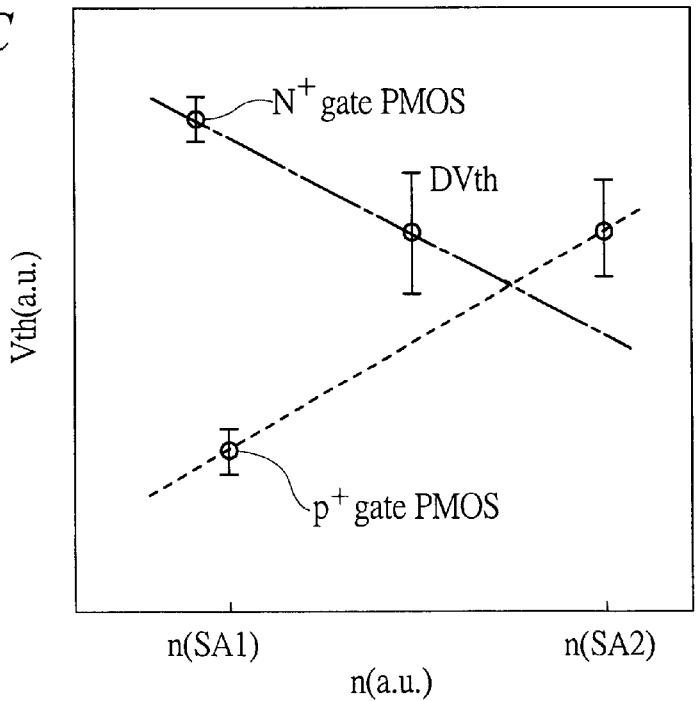
FIG. 2C is a view showing a relation between an impurity density in each channel of PMOS transistors and a threshold voltage thereof, and a relation between the impurity density and threshold voltage deviation thereof.
Figure 4:
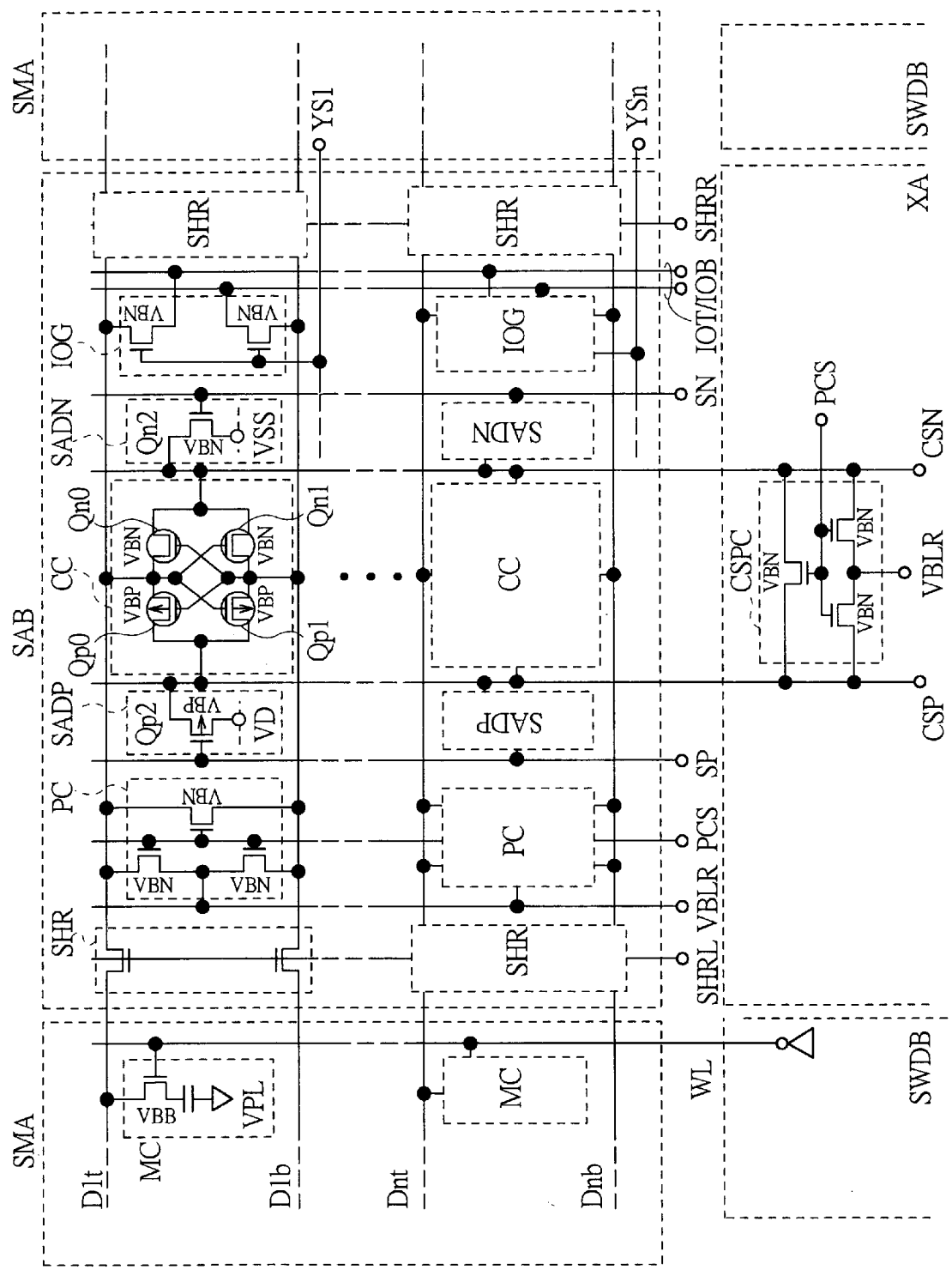
FIG. 4 is a circuit diagram showing a part corresponding to a sense amplifier according to a first embodiment to which the present invention is applied.
Figure 5:
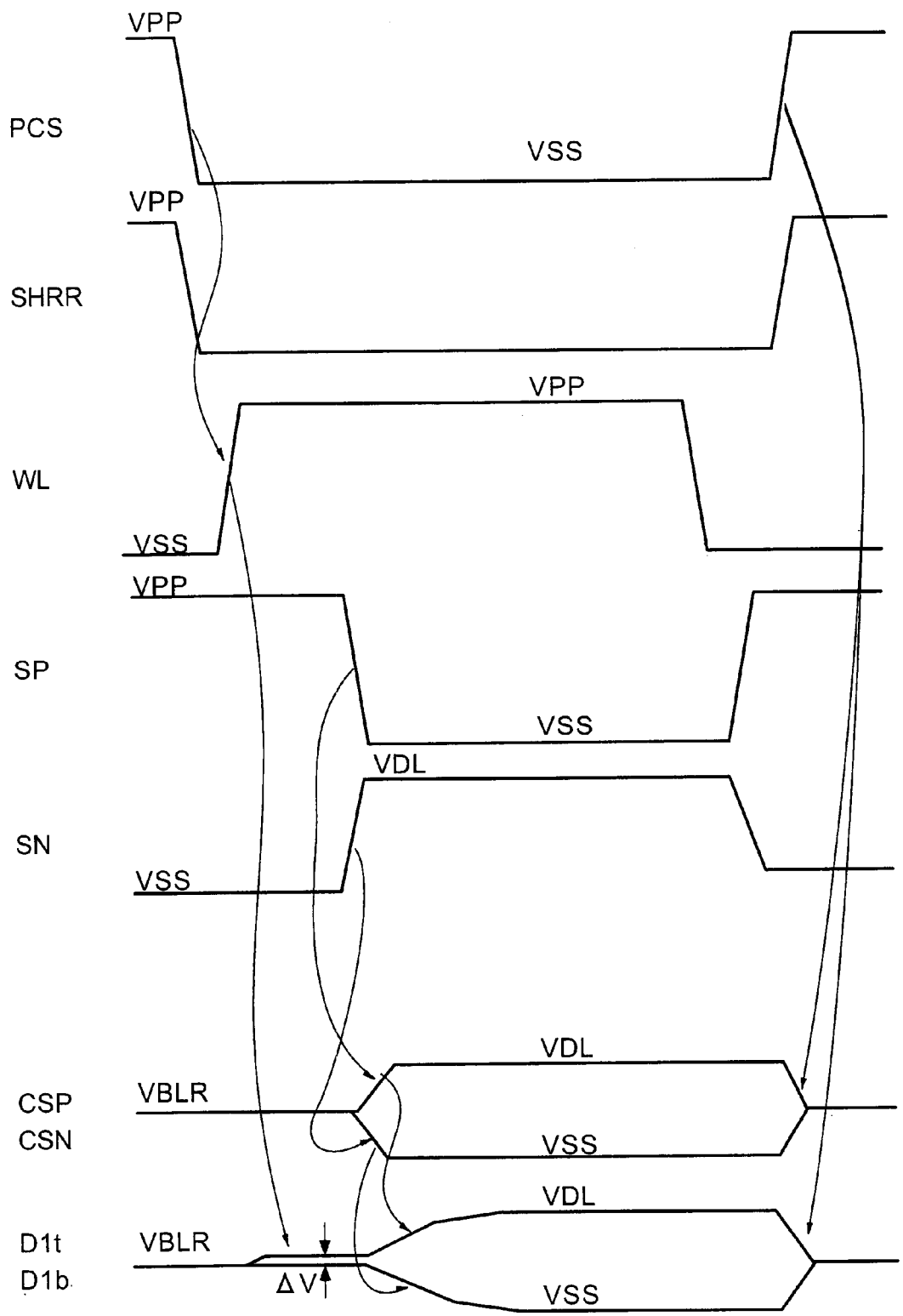
FIG. 5 is a waveform chart showing an operation of a first embodiment to which the present invention is applied.
Figure 6:
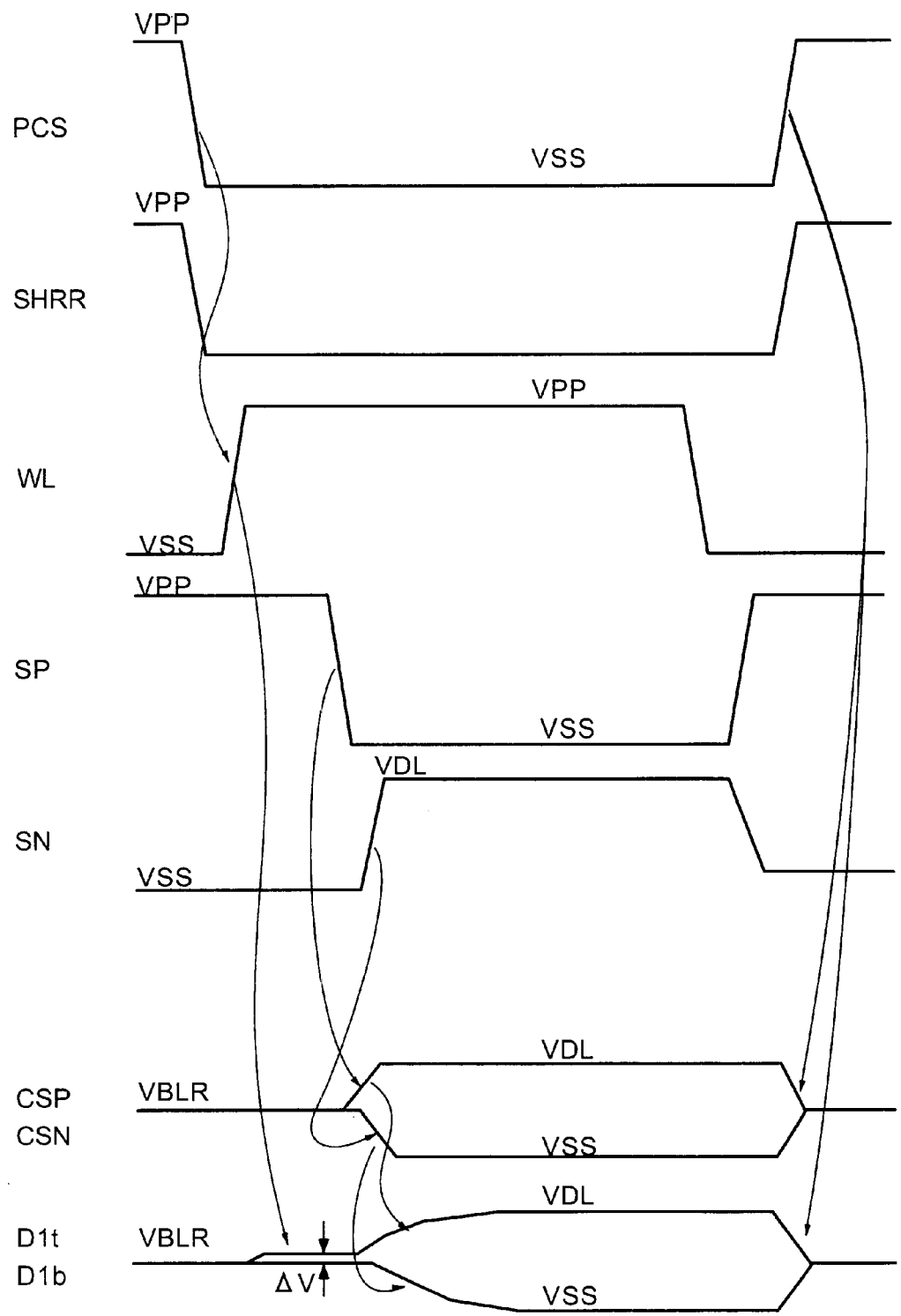
FIG. 6 is a waveform chart showing an operation performed when PMOS precedence is performed in a first embodiment to which the present invention is applied.
Figure 7:
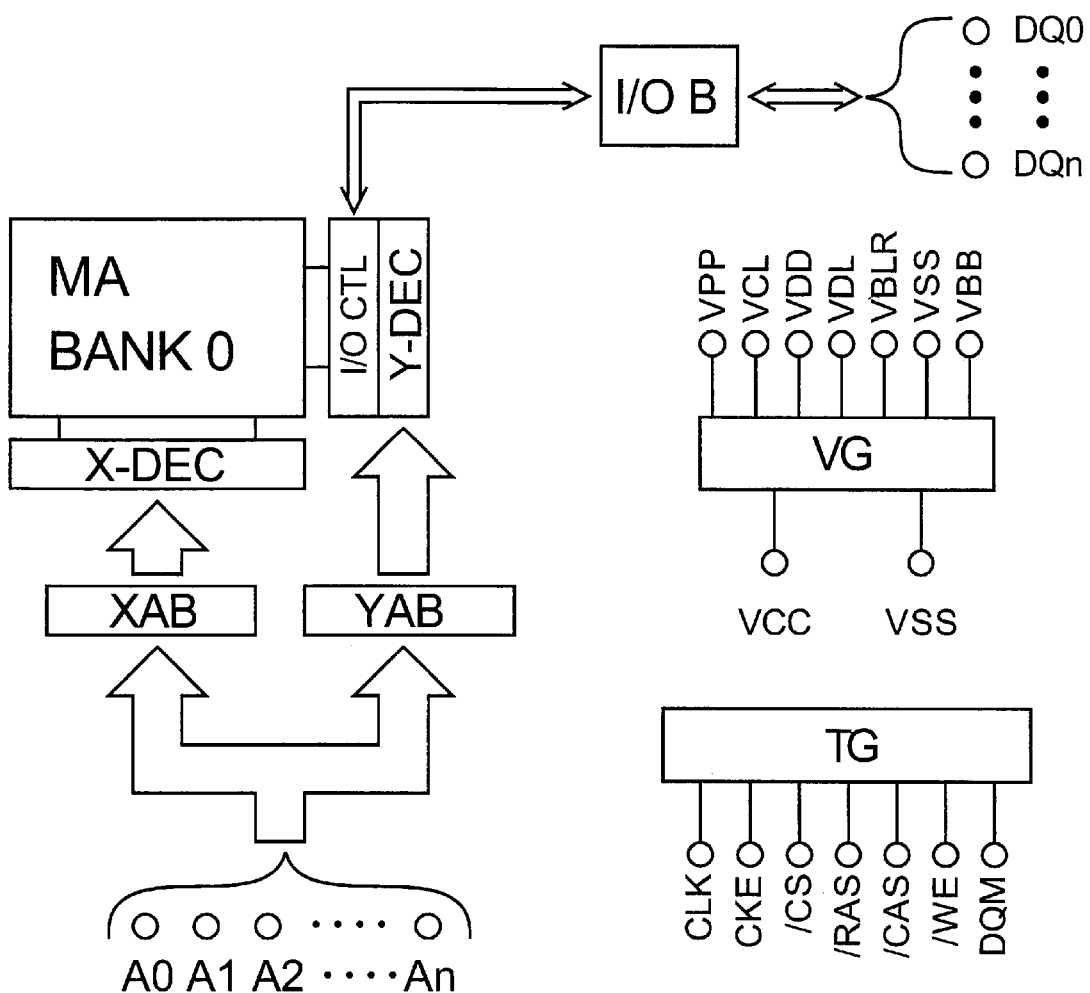
FIG. 7 is a block diagram showing the entire configuration of an SDRAM to which the present invention is applied.
Figure 8A:
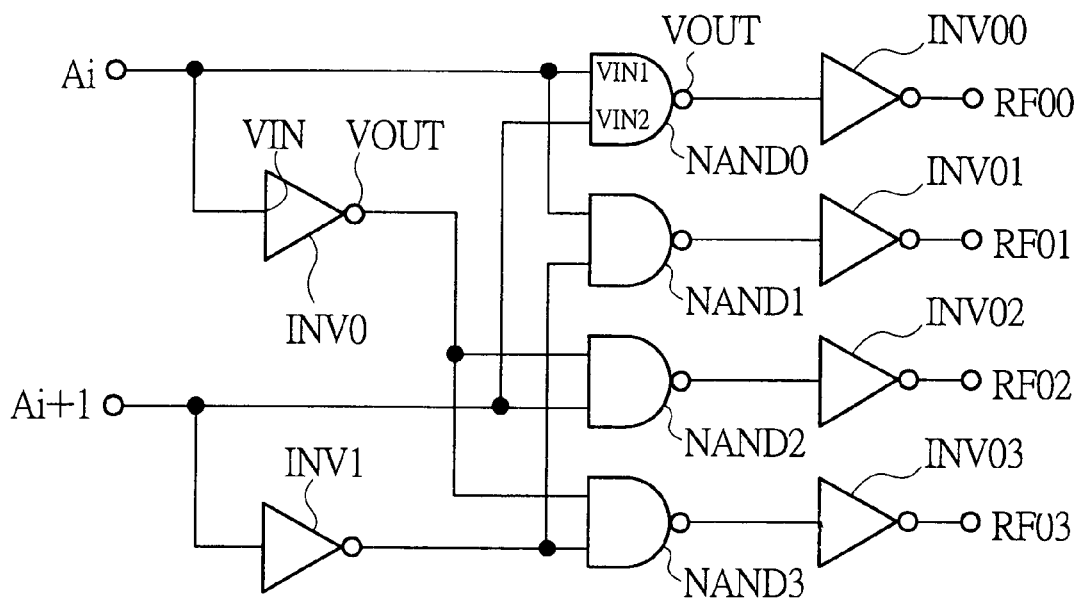
FIG. 8A is a circuit diagram showing a decoder circuit to which the present invention is applied.
Figure 8B:
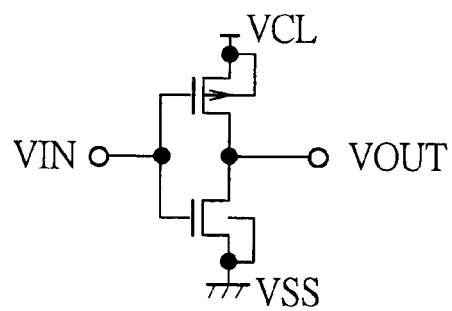
FIG. 8B is a circuit diagram showing an inverter to which the present invention is applied.
Figure 8C:
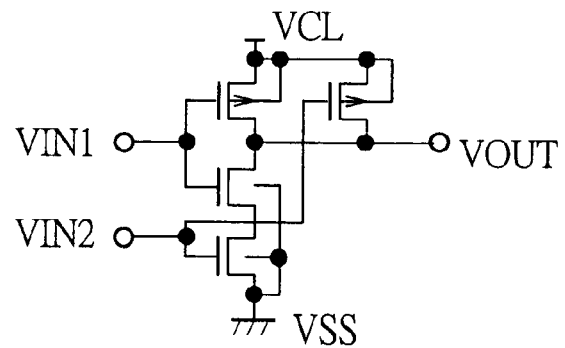
FIG. 8C is a circuit diagram showing a NAND circuit to which the present invention is applied.
Figure 9:
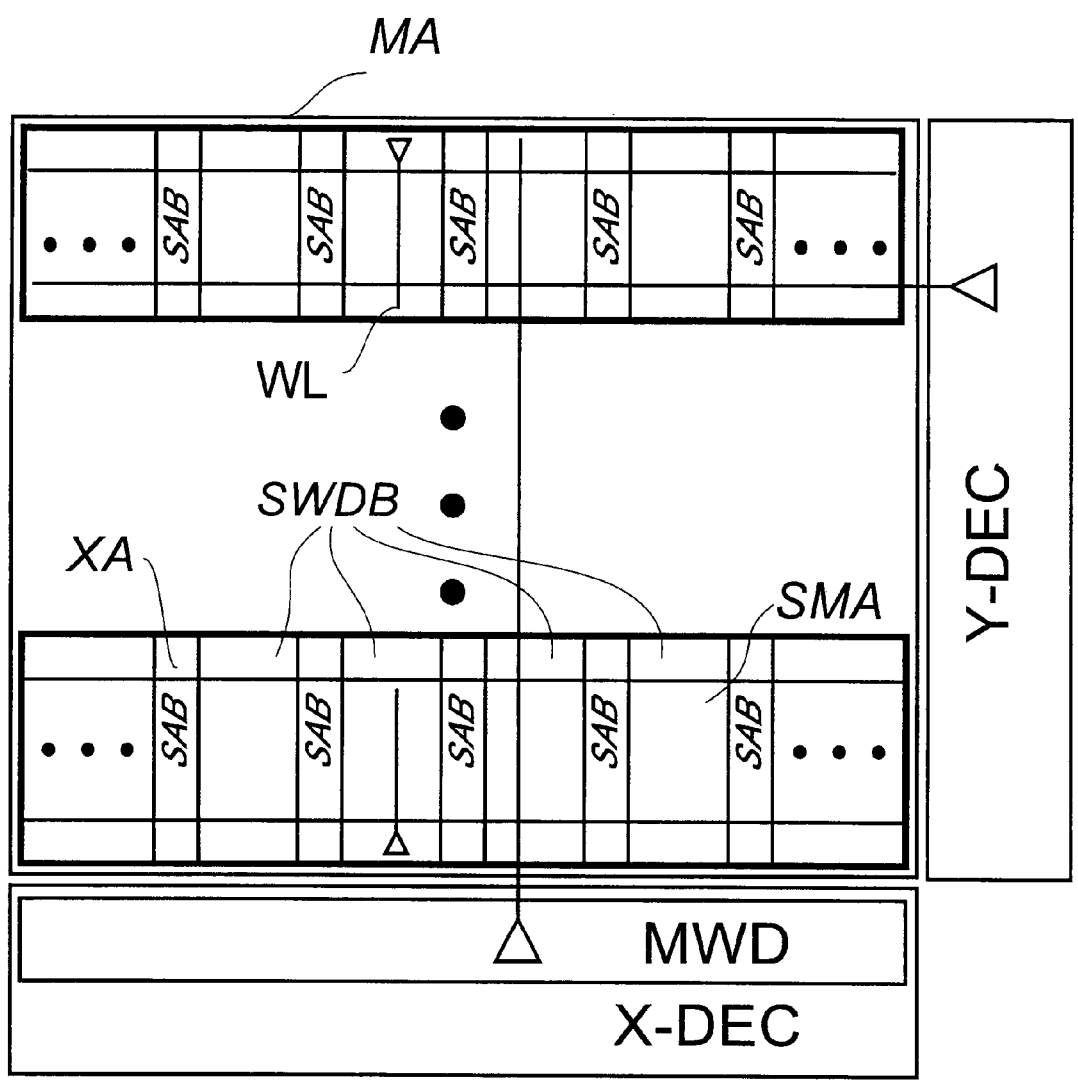
FIG. 9 is a diagram showing the division of a memory array, to which the present invention is applied, into sub-memory arrays.

A first embodiment of the present invention will be described with reference to FIGS. 1 to 9. FIG. 1A is a layout diagram showing a transistor channel region and a sense amplifier of a DRAM to which the present invention is applied. FIG. 1B is a layout diagram showing a sense amplifier cross coupling section. FIG. 1C is a cross-sectional view showing a sense amplifier cross coupling section. FIG. 2A is a cross-sectional view showing a PMOS transistor of a sense amplifier cross coupling section and a PMOS transistor for a sense driver. FIG. 2B shows distributions of channel impurities to a deepening direction of each substrate of PMOS transistors. FIG. 2C is a view showing a relation between an impurity density in each channel of PMOS transistors and a threshold voltage thereof, and a relation between the impurity density and threshold voltage deviation thereof. FIGS. 3A, 3B, 3C and 3D are each a cross-sectional view showing each part of a sense amplifier, a memory array, and a subword driver. FIG. 4 is a circuit diagram showing a part corresponding to a sense amplifier according to a first embodiment. FIG. 5 is a waveform chart showing an operation of a first embodiment. FIG. 6 is a waveform chart showing an operation performed when PMOS precedence is performed. FIG. 7 is a block diagram showing the entire configuration of an SDRAM to which the present invention is applied. FIG. 8A is a circuit diagram showing a decoder circuit. FIG. 8B is a circuit diagram showing an inverter. FIG. 8C is a circuit diagram showing a NAND circuit. FIG. 9 is a diagram showing the division of a memory array into submemory arrays.

With reference to FIG. 1A, an example in which a memory array MA in a DRAM chip Chip and a part of a peripheral circuit peri are divided into regions by channel implantation amount of transistors will be described below. A memory cell transistor channel region PINP(SMA) of a submemory array SMA has an impurity density of p(SMA). An NMOS transistor channel region PINP(SWD) of a subword driver block SWDB has an impurity density of p(SWD), and a PMOS transistor channel region NINP(SWD) has an impurity density of n(SWD). A sense amplifier block SAB has an NMOS transistor channel region PINP(SA1) in a transistor of a cross coupling section CC and an NMOS transistor channel region PINP(SA2) other than the NMOS transistor channel region PINP(SA1). The impurity densities of these regions are p(SA1) and p(SA2), respectively. Similarly, the sense amplifier block SAB has a PMOS transistor channel region NINP(SA1) in the transistor of the cross coupling section CC and an PMOS transistor channel region NINP(SA2) other than the PMOS transistor channel region NINP(SA1). The impurity densities of these regions are n(SA1) and n(SA2), respectively. An NMOS transistor channel region PINP(peri) of the peripheral circuit peri is an NMOS transistor channel region for a peripheral circuit or the like such as a decoder circuit and has an impurity density of p(peri). Similarly, a PMOS transistor channel region NINP(peri) is a PMOS transistor channel region for a peripheral circuit such as a decoder circuit or the like and has a channel impurity density of n(peri).

An example of the layout of the cross coupling section CC and an example of a sectional view taken along line A-A' in the layout diagram will be described with reference to FIGS. 1B and 1C. Respective detailed sectional structures of the sense amplifier block SAB, the subword driver SWD, and the submemory array SMA will be described below with reference to FIG. 3. The sense amplifier according to the present invention is characterized in that transistors which are each equal in thickness of gate oxide but are small in channel implantation amount, that is, in an impurity density of channel of the transistor channel region, in comparison with transistors of the respective peripheral circuits peri and used as $P^+$-type gate PMOSs Qp0 and Qp1 and $N^+$-type gate NMOSs Qn0 and Qn1 which constitute the cross coupling section CC. More specifically, the relationships between densities of channel impurity of the cross coupling section CC and densities of channel impurity of the peripheral circuit peri meet p(SA1)<p(peri) and n(SA1)<n(peri). In addition, the relationships between densities of channel impurity of the cross coupling section CC and densities of channel impurity of the transistors adjacent to the cross coupling section CC meet p(SA1)<p(SA2) and n(SA1)<n(SA2).

Next, transistors having small amounts of channel implantation will be described by a $P^+$-type gate PMOS and an $N^+$-type gate NMOS which are used in the present invention. Each gate material of the transistor will be described first. As shown in FIGS. 1B and 1C, similarly to a $P^+$-type gate PMOS of a $P^+$-type polysilicon gate $P^+$poly and an $N^+$-type gate NMOS of an $N^+$-type polysilicon gate $N^+$poly, when polarity of the gates is equal to that of carriers in the channel, the channel is formed immediately below the gates in the silicon substrate, i.e., comes to a surface channel. As used in a conventional DRAM, when polarity of a gate material is different from that of a channel material, a channel comes to a buried channel. A transistor using the surface channel has a current-driving force larger than a transistor using the buried channel and achieves preferable short channel characteristics.

Next, an example of channel implantation will be described with reference to FIGS. 2A, 2B, and 2C. FIG. 2A shows an example of a cross-sectional view of a PMOS Qp0 (channel region is an NINP(SA1)) of the cross coupling section CC according to the present invention and a PMOS Qp2 (channel region is an NINP(SA2)) of the sense driver. FIG. 2B shows an example of a channel impurity distribution (n) to a deepening direction (Depth) of a substrate of the PMOS. FIG. 2C shows an example of the relationship between an impurity density (n) in the channel of the PMOS, a threshold voltage (Vth: the Y axis of the graph), and a threshold voltage deviation (DVth: indication as each length of error bars in the graph).

In FIG. 2A, the gate is a $P^+$-type polysilicon gate $P^+$poly, and a layer of a tungsten W which is a metal is laminated on the gate for the purpose of reducing resistance of a gate wiring layer. Reference symbol L(P) denotes a P-type semiconductor region of a PMOS transistor diffusion layer. The P-type semiconductor region serves as a source/drain region of the transistor. Similarly to FIG. 1, reference symbols n(SA1) and n(SA2) denote channel impurity densities of the PMOSs, respectively. As shown in FIG. 2B, by a channel implantation amount and an implantation method, impurity density distributed in the deepening direction (Depth) of a substrate of the transistor channel shown in FIG. 2A, and peak value thereof are determined. This is the channel impurity amount, and is a parameter which determines a threshold voltage indicating transistor characteristics. In FIG. 2B, the channel impurity amounts are n(SA1) and n(SA2) which are peak values of the channel impurity distribution.

The relationship between the impurity density and the threshold voltage means, as shown in FIG. 2C, that the impurity density is small, i.e., that the smaller the channel implantation amount becomes, the lower the threshold voltage becomes. For example, when arsenic (As) or phosphorous (P) is implanted as an impurity in the channel of the $P^+$-type gate PMOS, the threshold voltage is about 0.2 V in the case where the impurity density of channel is about $1 \times 10^{18}$ cm$^{-3}$. However, when the channel implantation amount is reduced, the threshold voltage is –0.1 V (because the PMOS is used, a sign of an actual threshold voltage is inverted). In addition, as shown in FIG. 2C, as the impurity density of channel becomes lower, a deviating amount DVth of threshold voltage is also reduced. The relationship between the impurity density of channel and the threshold voltage deviation in this channel is described by Equation (4.64) in [Reference Document 2]. When the channel implantation amount is reduced, the threshold voltage deviation in the transistor caused by the channel implantation can be reduced.

In this manner, in the $N^+$-type gate NMOS and the $P^+$-type gate PMOS, when the channel implantation, i.e., the density of channel impurity is lowered, the threshold voltage can be reduced. More specifically, reduction in the threshold voltage and reduction in the deviation of threshold voltage are compatible with each other. On the other hand, in a conventional $N^+$-type gate PMOS, as shown in FIG. 2C, the threshold voltage increases as the impurity density of channel becomes lower. That is, in order to realize transistors having low threshold voltage required for a low-voltage operation, the channel impurity amount cannot be reduced. For this reason, the deviation of threshold voltage cannot be reduced.

When a $P^+$-type gate PMOS and an $N^+$-type gate NMOS each having a low density of channel impurity are used, the threshold voltages thereof become so low that OFF currents of the transistors increase, and thereby there is the case where standby currents may be increased by subthreshold leakage currents. In this case, each substrate voltage VBP of the PMOSs Qp0 and Qp1 of the cross coupling section CC is set to be higher than a data line swing voltage VDL, so that the threshold voltage can be compensated by the substrate bias effect. Similarly, when each substrate voltage VBN of NMOSs Qn0 and Qn1 of the cross coupling section CC is set to be lower than the ground potential VSS, the threshold voltage can be compensated by the substrate bias effect. In this manner, the present invention is also characterized in that a leakage current can be reduced. When the leakage current does not deserve being considered, a configuration in which the substrate voltage is not applied is preferably used to achieve a high-speed operation. The substrate voltage is limited by a sectional structure of the periphery of a submemory array SMA, as shown in FIGS. 3A to 3D.

Next, an element of a sectional structure including a subword driver SWD, the sense amplifier block SAB, and the submemory array SMA which are applied to the present invention will be described below with reference to FIGS. 3A to 3D. The transistor of a memory cell MC is constituted by an NMOS. The NMOS uses an $N^+$-type polysilicon gate $N^+$poly including a layer of $N^+$-type polysilicon, as a gate electrode. In this embodiment, in order to reduce resistance in a gate wiring layer, a metal layer of, e.g., tungsten W is formed on the $N^+$-type polysilicon gate $N^+$poly. The PMOS uses a $P^+$-type polysilicon gate $P^+$poly including a $P^+$-type polysilicon layer, as a gate electrode. Similarly to the NMOS, a metal layer of tungsten W is arranged on the $P^+$-type polysilicon gate $P^+$poly. Reference numeral SGI denotes an element isolation region which is an oxide film for insulation between diffusion layers.

Figure 3A:
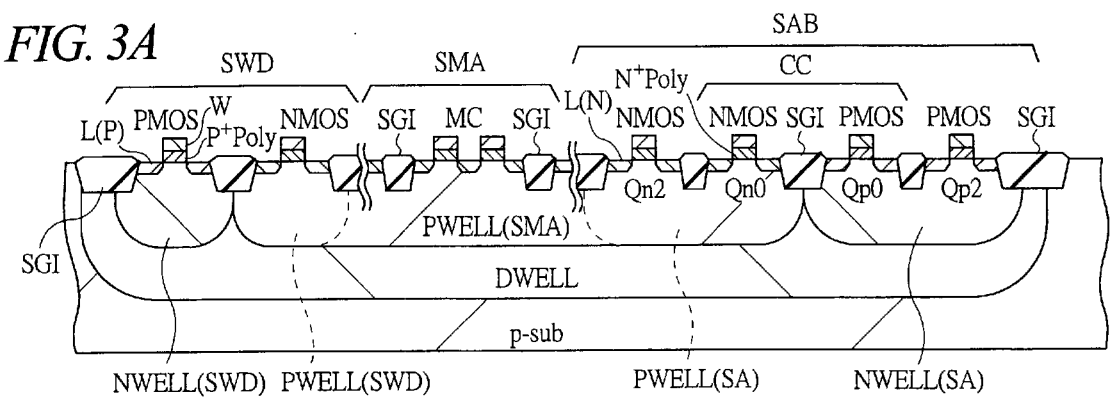
FIG. 3A is cross-sectional view showing each part of a sense amplifier, a memory array, and a subword driver to which the present invention is applied.

In the configuration shown in FIG. 3A and being the most preferable for the present invention, a P-type semiconductor region PWELL(SAM) which is a substrate region of the memory cell transistor of the submemory array SMA, and a P-type semiconductor region PWELL(SA) which is a substrate region of the NMOS of the sense amplifier block SAB are electrically connected to each other to constitute one region. The submemory array substrate region PWELL (SMA) and the sense amplifier NMOS substrate region PWELL(SA) are not separated electrically from each other, so that an area can be reduced up to size of the isolation region. In this manner, a voltage of a substrate region PWELL(SA) of the sense amplifier NMOS can be set to be equal to that of the submemory array substrate region PWELL(SMA), e.g., to a voltage VBB. A deep N-type semiconductor region DWELL is disposed at a deeper position than the substrate in the submemory array substrate region PWELL(SMA). In this manner, an N-type semiconductor region NWELL(SWD) which is a substrate region of the PMOS of the subword driver SWD, and an N-type semiconductor region NWELL(SA) which is a substrate region of the PMOS of the sense amplifier block SAB are electrically connected to each other. In the subword driver SWD, since the substrate voltage of the PMOS must be equal to or higher than a word line boost voltage VPP, the voltage of the sense amplifier PMOS substrate region NWELL(SA) is set to be equal to or higher than the word line boost voltage VPP similarly to a subword driver PMOS substrate region NWELL(SWD). More specifically, in this configuration, the substrate voltage VBN of the NMOS of the sense amplifier is set to be equal to the voltage VBB which is equal to the voltage of the memory cell, and the substrate voltage VBP of the PMOS is set to be equal to or higher than the voltage VPP.

An example of s circuit configuration of a sense amplifier to which the present invention is applied will be described with reference to FIG. 4. Data line pairs D1t and D1b, . . . , Dnt and Dnb connected to the left and right submemory arrays SMA are connected to the transistors of the cross coupling section CC in the sense amplifier block SAB, respectively.

A circuit configuration formed in the sense amplifier block SAB will be described first. A precharge circuit PC is a circuit for setting the data line pairs at a precharge level, in general, at a precharge potential VBLR which is ½ of a data line swing voltage, by a precharge control signal PCS in a standby state. For example, the precharge circuit PC is constituted by MOSs short-circuit between the data lines, and switches connecting the data lines and the precharge potential VBLR. An input/output gate circuit IOG is a section which inputs/outputs data to/from the data lines and the outside of the memory cell array. For example, the input/output gate circuit IOG is constituted by an NMOS controlled by column selection lines YS1, . . . , YSn between the data lines and input/output lines IOT and IOB as shown in FIG. 4. Share gate circuits SHR arranged in both sides of the sense amplifier are selection switches for connecting any one of the submemory arrays SMA arranged in both sides of the sense amplifier, to the transistors of the cross coupling section CC, by share gate control signals SHRL and SHRR. For example, the share gate circuits SHR are constituted by transfer type switches of NMOSs as shown in FIG. 4.

The sense amplifier cross coupling section CC is a circuit for amplifying a low-level signal being read from the memory cell MC up to a data line amplitude, and frequently uses the two NMOSs Qn0 and Qn1 and the PMOSs Qp0 and Qp1 which are cross-coupled to each other as shown in FIG. 4. The cross coupling section CC is driven by a PMOS-side common source line CSP and an NMOS-side common source line CSN. The respective common source lines CSP and CSN are driven by a plurality of sense drivers SADP and SADN dispersively arranged in the sense amplifier. Such a configuration that only one of the sense drivers SADP and SADN is arranged in each intersection area XA can be used. A PMOS Qp2 and a NMOS Qn2 are activated by respective sense amplifier activation signals SP and SN, and drive the common source lines. The common source lines CSP and CSN are controlled by a data line precharge control signal PCS in a standby state, and are precharged to the precharge potential VBLR by a common source line precharge circuit CSPC arranged in the intersection area XA which is a cross region between the subword driver block SWDB and the sense amplifier block SAB.

As described above, a channel region of each NMOS transistor of the precharge circuit PC, the input/output gate circuit IOG, the share gate circuit SHR, and the sense driver SADN is the region PINP(SA2), and a channel region of each NMOS transistor of the cross coupling section CC is the PINP(SA1). A channel region of the PMOS transistor of the sense drivers SADP is NINP(SA2), and a channel region of each PMOS transistor of the cross coupling section CC is NINP(SA1).

Next, an example of the operation of this circuit configuration will be described with reference to FIG. 5. The precharge control signal PCS which controls precharging of the data line pairs from a bank active signal is changed from the voltage VPP or a potential of VDL or more, to the voltage VSS. At almost the same time, a signal selects a submemory array SMA from which data are to be read. (In this case, if the left submemory array SMA is selected, a signal of the share gate control signal SHRR is changed from the voltage VPP to the voltage VSS, and the right submemory array SMA is separated from the sense amplifier block SAB. Thereafter, an address (A0, . . . , An) input from the outside or an address generated in the circuit configuration is pre-decoded by a decoder circuit as shown in FIG. 8 described later. In addition, the pre-decoded signal is decoded by a main word driver (MWD), a subword driver (SWD) or the like, and thereby a word line WL is selected, and the data held in the memory cell MC appears in the data lines D1t, D1b, . . . . At this time, a small signal generated between the data lines is a read signal voltage $\Delta V$.

In addition, after the data have been sufficiently read, a NMOS-side sense amplifier activation signal SN is changed from the potential VSS to the voltage VDL or a potential of VDL or more. At almost the same time, a PMOS-side sense amplifier activation signal SP is changed from the voltage VDL or a potential of VDL or more, to the voltage VSS. In this manner, the sense amplifier common source lines CSN and CSP are connected to the voltages VSS and VDL, respectively, and the data lines D1t, D1b, . . . are set at the data line swing voltage VDL (high-potential side) and the ground potential VSS (low-potential side), respectively, on the basis of the read signal voltage $\Delta V$. At this time, if the threshold voltage difference between the transistors of the cross coupling section CC is by $\Delta Vth$ with respect to the read signal voltage $\Delta V$, an effective signal voltage which is actually sensed by the sense amplifier is given by $\Delta V-\Delta Vth$. Since the threshold voltage deviations of the transistors are reduced by the present invention, the threshold voltage deviation $\Delta Vth$ between the pair of MOSs of the cross coupling section CC becomes lower. In this manner, the effective signal voltage increases. After completion of the amplification, an operation such as a sense amplifier data holding operation, a data reading operation, a data writing operation, or the like is performed.

Next, an example of a precharge operation will be described. In the precharge operation, the word line WL is first set at the voltage VSS. Thereafter, the sense amplifier activation signals SP and SN are set at a potential of VDL or more and the ground potential VSS, respectively. The data line is precharged to the precharge level VBLR by the precharge control signal PCS. At almost the same time, the share gate control signal SHRR selected by the memory array rises, the sense amplifier and the right submemory array SMA are connected to each other and come to a standby state.

In this case, when a data pattern read from one word line is considered, the worst case where amplification time of each sense amplifier is maximum is the case where an interested sense amplifier reads "L" data and all the other sense amplifiers read "H" data. When the drive timings of the activation signals SP and SN of the sense amplifiers are the same, an NMOS having a high driving force starts to be amplified first, and the data sense amplifiers which read "H" and which each have high gate-source voltage for the NMOS is amplified prior to the data sense amplifier which read "L". In this case, the potential of a common source is varied by currents of most of the sense amplifiers which are operated ahead, and a voltage applied to the interested sense amplifier which outputs "L" data decreases, and amplification thereof is delayed.

In such a case, as shown in an example of FIG. 6, when the drive timings of the activation signals SP and SN of the sense amplifier on a PMOS side are ahead activated by the activation signal SP (PMOS preceding drive), amplification time of the "L" data which the interested sense amplifier reads can be shortened. This is because an amplification speed of the "L" data whose a gate-source voltage for the PMOS becomes high is increased by ahead driving the PMOS side with a low driving force, and the difference between the amplification times of the "H" data and the "L" data can be reduced. However, in this case, since a sensing operation in the sense amplifier is performed by the PMOS, the sensing operation affects the threshold voltage deviations of the pair MOS of PMOSs of the cross coupling section CC. More specifically, in the conventional configuration, since the threshold voltage deviations of the pair of PMOSs become large, there arise drawbacks of reducing an effective signal voltage and of occurring an erroneous operation when the PMOS preceding drive is performed. However, by using the present invention, since the threshold voltage deviations of the PMOSs of the cross coupling section CC are reduced, the possibility that the erroneous operation occurs becomes lower even though the PMOS preceding drive is performed, and further the sensing operation can be performed at a high speed.

Next, an example of a synchronous DRAM (SDRAM) to which the present invention is applied will be described below with reference to FIG. 7. The respective circuit blocks are operated at timings of internal control signals generated by a timing signal generation circuit TG to which a control signal is input. As control signals being input to the timing signal generation circuit TG, there are a chip selection signal/CS, a row address strobe signal/RAS, a column address strobe signal/CAS, and a write enable signal /WE at the timings of a clock signal CLK. Combinations of these control signals and address signals are called commands. A clock enable signal CKE determines whether the clock signal is valid or invalid. An input/output mask signal DQM is a signal for controlling a data input and output buffer I/OB in order to mask data being input/output from input/output terminals DQ0, . . . , DQn. Reference symbol VG denotes a voltage generation circuit VG for the SDRAM and supplies various potentials such as a word line boost voltage VPP, a substrate voltage VBB for a memory array, a memory array voltage VDL, a peripheral circuit voltage VCL, or the like.

In the SDRAM, a multi-address scheme is adopted in which row addresses and column addresses are input from address input terminals A0, A1, . . . , An in a time-sharing manner. Row addresses being input from the address input terminal to a row address buffer XAB are arranged in the peripheral circuit peri in FIG. 1A. As shown in FIG. 8A as an example, input low addresses Ai and Ai+1 are decoded by a low address decoder X-DEC by means of inverters INV0, INV1, INV00, . . . shown in FIG. 8B and/or a decoder circuit using a NAND circuit NAND shown in FIG. 8C to generate predecode signals RF00, RF01, RF02, and RF03. In the circuit of the decoder section shown in FIGS. 8A to 8C, in order to prevent the threshold voltage of the transistor from being increased by the substrate bias effect, the substrate voltages of the NMOS and the PMOS are set to be equal to the source potential. That is, the substrate voltage is VSS (0 V) in the NMOS, and the substrate voltage is VCL in the PMOS. In the same scheme, other predecode signals generated from other addresses are used to select a specific word line in one memory array MA. According to this selection, each memory cell of one word comes to a selection state. Subsequently, when column addresses are input into a column address buffer YAB, memory cells from which data is read or in which data is written are further selected by a column address decoder Y-DEC arranged in the peripheral circuit peri in FIG. 1. Although the SDRAM generally has a plurality of memory arrays (or memory banks) designated by bank addresses, only one memory array MA (BANK0) is typically illustrated in this drawing.

As shown in FIG. 9 as an example, one bank of a DRAM to which the present invention is applied is constituted by a plurality of memory regions surrounded by both the row address decoder X-DEC for selecting a word line from a row address and the column address decoder Y-DEC for selecting a data line from a column address. The memory regions include a plurality of submemory arrays SAM arranged in the form of a matrix. Although the memory arrays are not restricted specifically, the memory arrays adopt a hierarchical word line scheme, and a main word driver column MWD is arranged on one side of the memory arrays MA. The main word line connected to the main word driver column MWD is formed on an upper metal wiring layer so as to be laid across the plurality of submemory arrays SMA. Selection of each column direction adopts a common Y decoder scheme provided such that a plurality of column selection lines YS being output from the column address decoder Y-DEC is laid over the plurality of submemory arrays SMA. In this case, the submemory array SMA means a minimum memory block surrounded by both a subword drive block SWDB constituted by a plurality of subword drivers SWDB and a sense amplifier block SAB constituted by a plurality of sense amplifiers.

As described above, advantages obtained in the configuration of the first embodiment are as follows. (1) A threshold voltage deviation is reduced by using a transistor having a small channel implantation, as a transistor of the cross coupling section CC, and the difference between the threshold voltages of a pair of MOSs becomes small, and an effective signal voltage is increased, and a data sensing/amplifying operation can be stably performed. (2) A low signal voltage obtained when bits of a low read signal voltage such as bits of a small capacity of a memory cell capacitor or bits of a large leakage current in a memory cell transistor or the like are selected can be accurately read, and fail bits can be reduced in number, and thereby the yield is improved. (3) When a substrate bias is applied, a threshold voltage increases, and a leakage current in a sense amplifier data holding state can be suppressed. In addition, when transistors having an normal amount of channel implantation are applied as the $P^+$-type gate PMOS Qp2 and the $N^+$-type gate NMOS Qn2 of the sense driver, a leakage current in a standby state can be reduced, and a power consumption can be reduced. (4) When the configuration in FIG. 3A is used to make both the substrate region of the NMOS of the sense amplifier block SAB and the substrate region of the submemory array SMA common, an isolation region is not required. Each layout area can be reduced, and each chip area can be reduced.

In [Reference Document 3] and [Reference Document 4], two types of gate sense amplifiers using an $N^+$-type gate NMOS and a $P^+$-type PMOS are described. However, attention is given to the relationship between a channel implantation amount and a threshold voltage, and there is no description that considers the amount of channel implantation.

(Modification of First Embodiment)

in addition, a modification of the first embodiment will be described with reference to FIG. 3 having been described above.

Figure 3B:
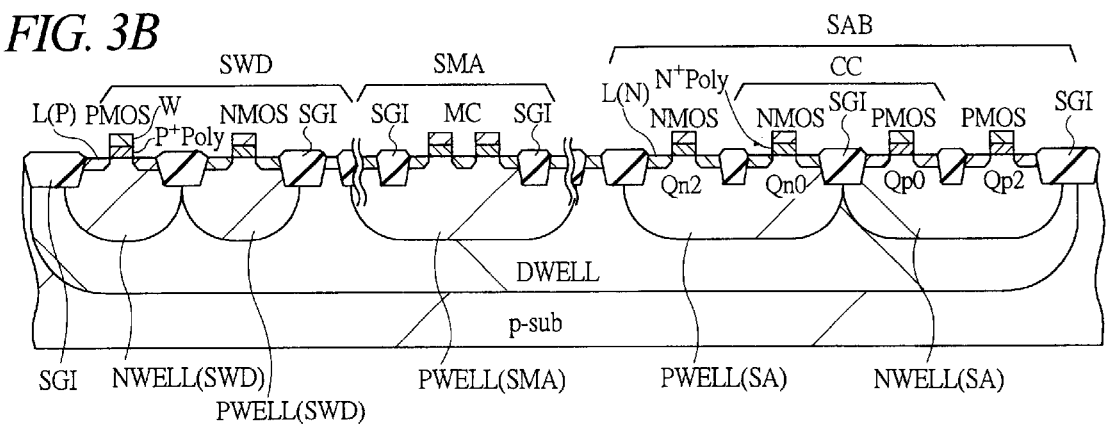
FIG. 3B is a cross-sectional view showing each part of a sense amplifier, a memory array, and a subword driver to which the present invention is applied.

As a sectional structure of the first embodiment, the configuration shown in FIG. 3B can be used in place of the configuration shown in FIG. 3A. Although the sectional structure shown in FIG. 3B has a larger layout area than the sectional structure shown in FIG. 3A, a submemory array substrate region PWELL(SMA) and a sense amplifier NMOS substrate region PWELL(SA) are isolated from each other, and the modification of the first embodiment is characterized in that potentials can be independently set. Effects obtained from this configuration are that, in addition to the effects (1), (2), and (3) which the first embodiment has, a substrate voltage VBN of the NMOS of the sense amplifier is set to be a voltage VSS to suppress the threshold voltage increased by a substrate bias effect, and a high-speed operation can be realized.

Figure 3C:
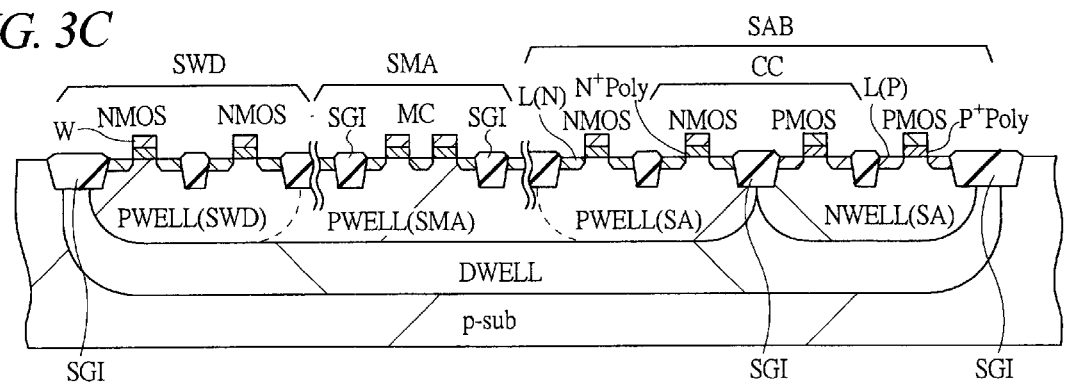
FIG. 3C is a cross-sectional view showing each part of a sense amplifier, a memory array, and a subword driver to which the present invention is applied.

As another modification of the first embodiment, a structure shown in FIG. 3C can also be used as a sectional structure of the first embodiment. The configuration shown in FIG. 3C, is a configuration in which no PMOS is used in the subword driver SWD. For this reason, the potential of the sense amplifier NMOS substrate region NWELL(SA) can be set to be an arbitrary voltage which is equal to or higher than a data line swing voltage (VDL) without separating DWELL. Effects obtained from this configuration are that, in addition to the effects (1), (2), and (3) described in the first embodiment, a substrate voltage VBP of the PMOS of the sense amplifier is set to be the voltage VDL to suppress the threshold voltage being increased by a substrate bias effect, and a high-speed operation can be realized.

Figure 3D:
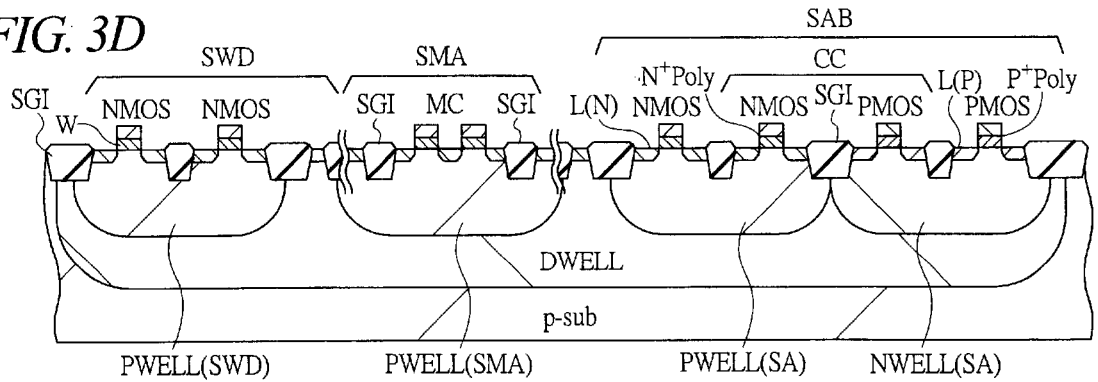
FIG. 3D is a cross-sectional view showing each part of a sense amplifier, a memory array, and a subword driver to which the present invention is applied.

In addition, as still another modification of the first embodiment, a sectional structure shown in FIG. 3D can also be used. The configuration shown in FIG. 3D is characterized in that, by combinations of the respective configurations shown in FIGS. 3B and 3C, no PMOS is used in a subword driver SWD, and a submemory array substrate region PWELL(SMA) and a sense amplifier NMOS substrate region PWELL(SA) are isolated from each other. For this reason, both a substrate voltage VBN of the NMOS and a substrate voltage VBP of the PMOS in the sense amplifier can be set to be arbitrary voltages. Effects obtained from this embodiment are that, in addition to the effects (1), (2), and (3) of the first embodiment, the substrate voltage VBN of the NMOS of the sense amplifier and the substrate voltage VBP of the PMOS in the sense amplifier can be set to be voltages VSS and VDL, respectively, and thereby a high-speed operation can be performed.

As a modification of a sense amplifier section, the sense driver SADP can be constituted by an NMOS. In this case, logic of the sense amplifier activation signal SP must be inverted.

(Second Embodiment)

Figure 10:
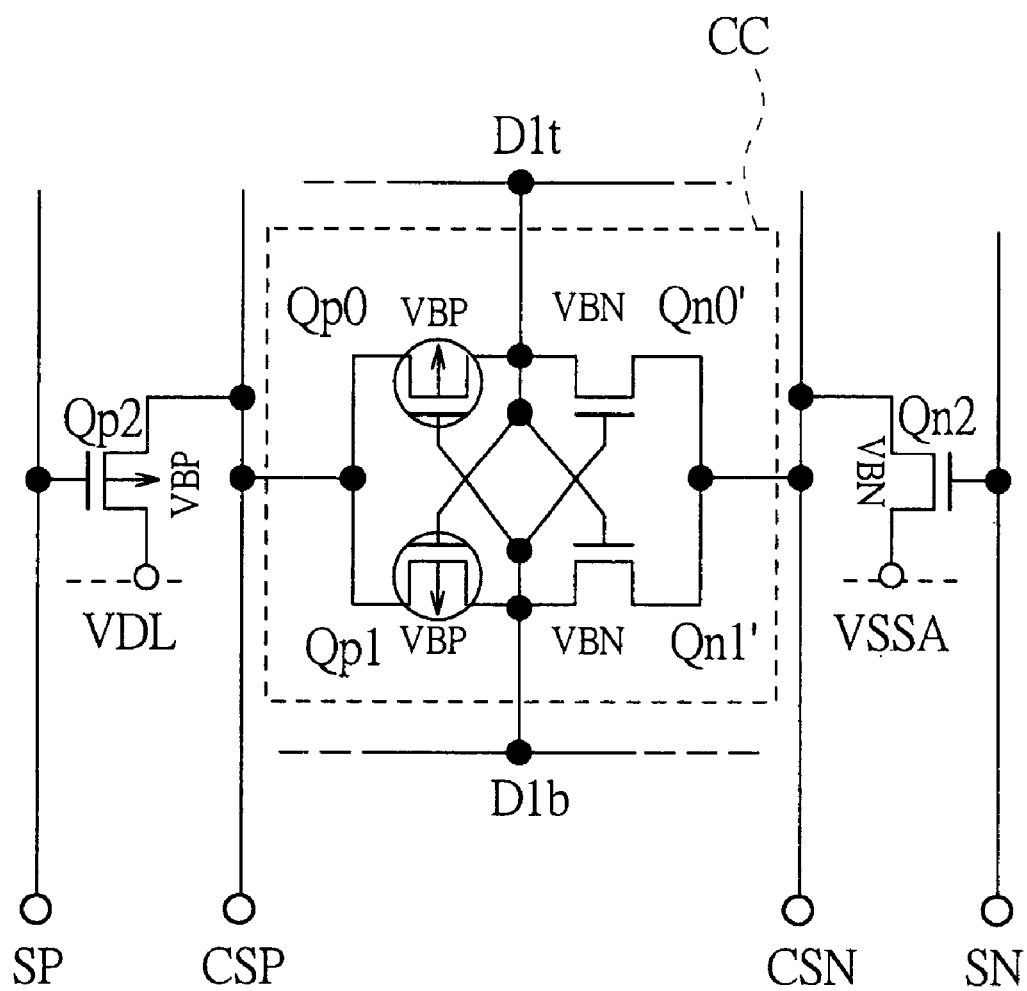
FIG. 10 is a circuit diagram showing a part of a sense amplifier according to a second embodiment to which the present invention is applied.

Next, a second embodiment will be described below with reference to FIG. 10. FIG. 10 is a circuit diagram showing a section of a sense amplifier of the second embodiment to which the present invention is applied.

In the second embodiment, as shown in the circuit configuration which is an example of a cross coupling section in FIG. 10, only the cross coupling section CC shown in FIG. 4 replaces the configuration shown in FIG. 10. The circuit configuration other than the cross coupling section CC is the same as the circuit configuration of the first embodiment. In the first embodiment, the NMOS and the PMOS whose transistors each have small amounts of channel implantation are used. In this configuration, as N+-type gate NMOSs Qn0' and Qn1' of the NMOSs, transistors having normal amounts of channel implantation are used, and only as N+-type gate PMOSs Qp0 and Qp1 of the PMOSs, transistors having small amounts of channel implantation are used. By this, since the threshold voltage deviations of the PMOSs are larger than those of the NMOSs, it is an object to reduce only the deviations of threshold voltages of the PMOSs. Since the number of kinds of transistors of the NMOSs is reduced in comparison with the first embodiment, there is an advantage of simplicity of the process steps. The waveform chart of the operation is the same as that of FIG. 4. Similarly to the first embodiment, a sense driver SADP can also be constituted by the NMOSs. In this case, logic of the sense amplifier activation signal SP shown in FIG. 5 which is an operation waveform chart must be inverted.

The sectional structure of this configuration will be described below. In the configuration shown in FIG. 3A which is the same as that of the first embodiment, the substrate voltages VBP of the PMOSs (Qp0 and Qp1) can be applied such that a voltage VPP (>VDL) and the threshold voltage are increased. On the other hand, with respect to the NMOSs, the substrate voltages VBN of the NMOSs (Qn0' and Qn1') are equal to a voltage VBB (<VSS). For this reason, although an operation speed decreases, a leakage current in a data holding state can be reduced.

Advantages of the configuration of the second embodiment are as follows. (1) By comparing NMOSs and PMOSs with each other and applying PMOSs each having small channel implantation to the PMOSs each having large deviations of the threshold voltages, the deviations of threshold voltages of the PMOSs can be suppressed, and the threshold voltage difference between the pair of PMOSs can be reduced, and a stable sensing/amplifying operation can be performed. (2) With respect to NMOSs, since the number of kinds of transistors is smaller than that of the first embodiment, the process steps can be simplified. The other effects thereof are the same as the first embodiment.

(Modification of Second Embodiment)

In addition, as a modification of the second embodiment, the sectional structure shown in FIG. 3B can also replace the sectional structure shown in FIG. 3A. In the second embodiment, since the NMOSs (Qn0' and Qn1') are transistors having normal amounts of channel implantation, threshold voltages are relatively high. For this reason, the substrate voltage VBN is set to be the voltage VSS to prevent the threshold voltage from being increased by the substrate bias effect, and thereby a high-speed operation can be performed.

As another modification of the second embodiment, the structure shown in FIG. 3C can also used as a sectional structure. In FIG. 3C, advantages of this configuration are that, in addition to the advantage (2) described in the first embodiment and the advantages (1) and (2) described in the second embodiment, the substrate voltages VBP of the PMOSs of a sense amplifier are set to be a voltage VDL and so a high-speed operation can be performed.

In addition, as still another modification of the second embodiment, the structure shown in FIG. 3D can also be used as a sectional structure. Advantages of this configuration are that, in addition to the advantage (2) described in the first embodiment and the advantages (1) and (2) described in the second embodiment, the substrate voltages VBN of the NMOSs of a sense amplifier and the substrate voltages VBP of the PMOSs of the sense amplifier are set to be voltages VSS and VDL, respectively, and so a high-speed operation can be performed.

(Third Embodiment)

Figure 11:
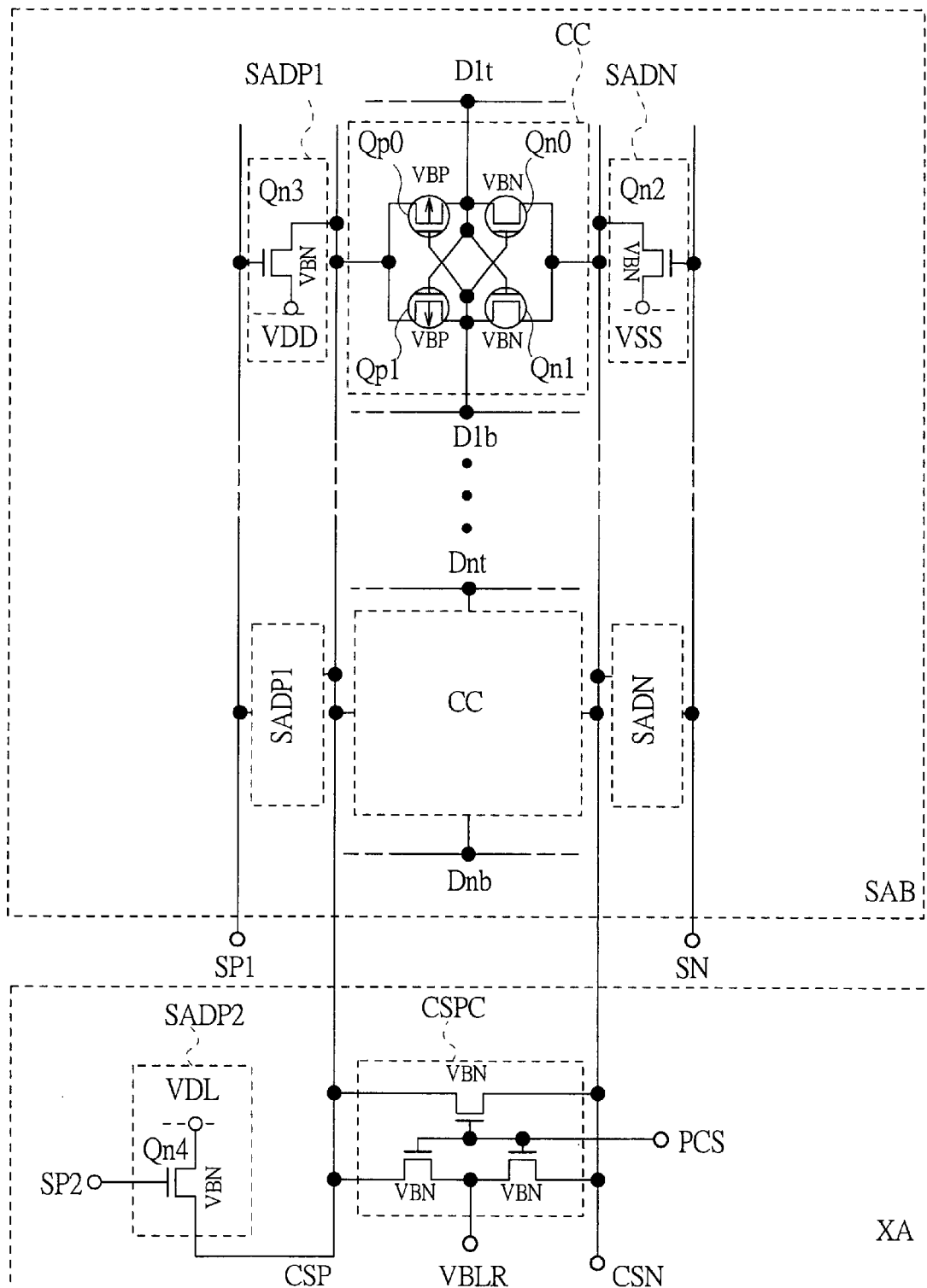
FIG. 11 is a circuit diagram showing a part of a sense amplifier according to a third embodiment to which the present invention is applied.
Figure 12:
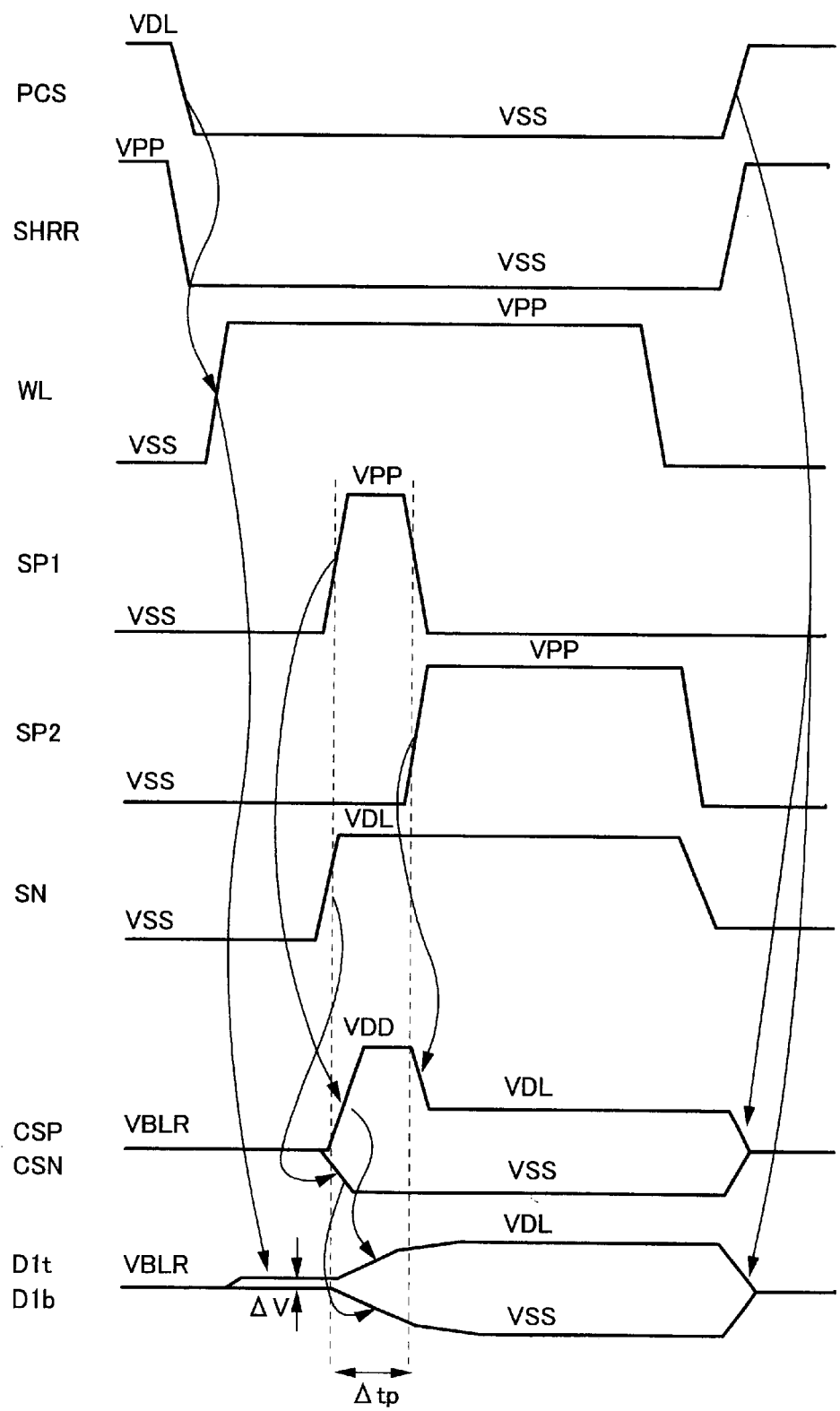
FIG. 12 is a waveform chart showing an operation of a third embodiment to which the present invention is applied.
Figure 13:
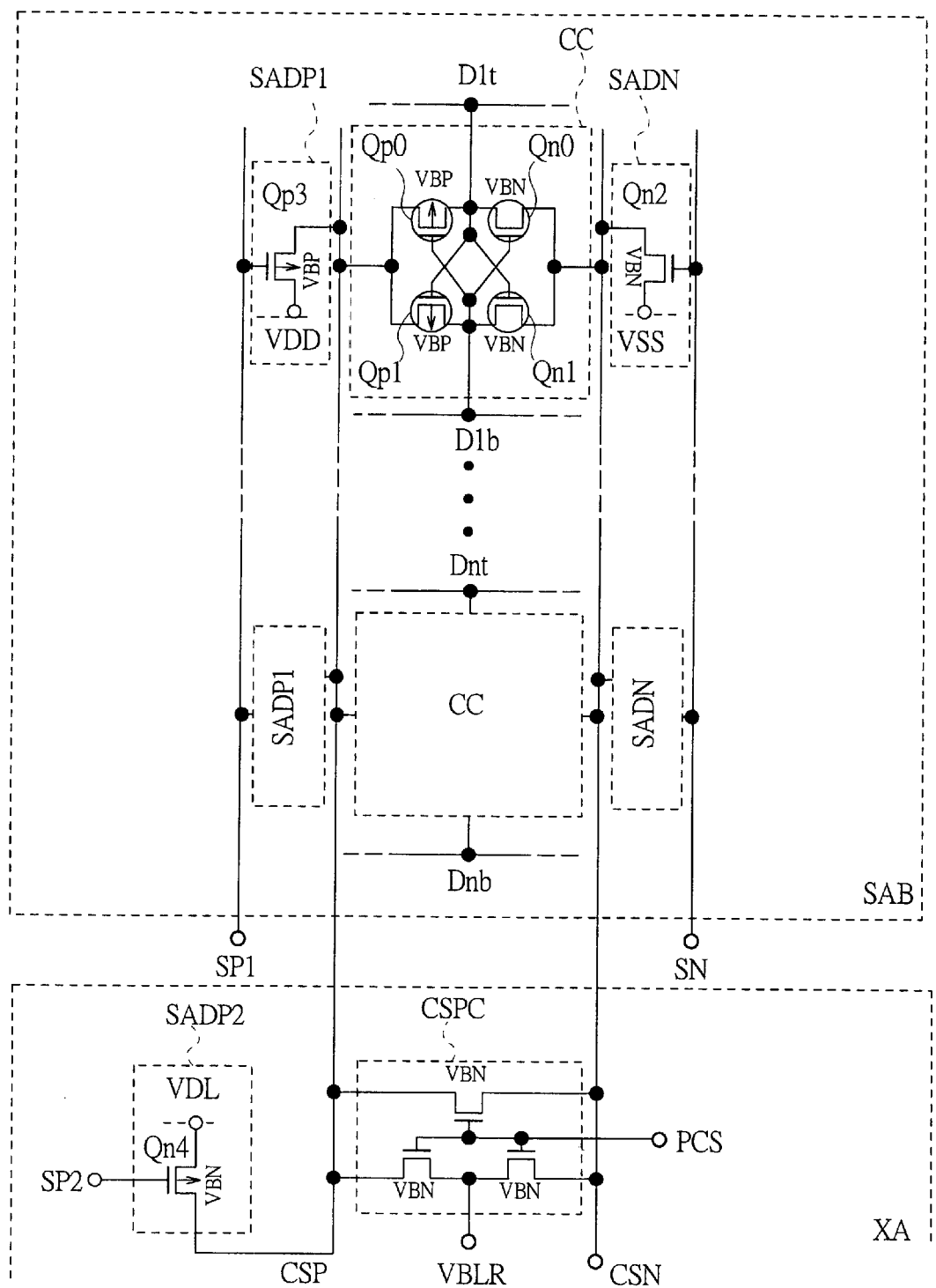
FIG. 13 is a circuit diagram showing a part of a sense amplifier according to a modification of a third embodiment to which the present invention is applied.

Next, a third embodiment will be described below with reference to FIGS. 11 to 13. FIG. 11 is a circuit diagram showing a section of a sense amplifier according to the third embodiment to which the present invention is applied. FIG. 12 is a waveform chart showing an operation of the third embodiment. FIG. 13 is a circuit diagram showing a section of a sense amplifier according to a modification of the third embodiment.

FIG. 11 shows only an example of a sense amplifier cross coupling section CC and common source lines CSP and CSN. The other sections shown in FIG. 11 are the same as those shown in FIG. 4 described above. This configuration is an example applied to an overdrive scheme in which the sense amplifier is driven by an overdrive voltage VDD higher than the data line swing voltage VDL for a predetermined period of a sensing operation relative to the configuration of the sense amplifiers described in the first embodiment. In comparison with the first embodiment, the sense amplifier is driven by a high voltage, and thereby high-speed amplification can be performed. Similarly to the first embodiment, deviations of threshold voltages of the transistors of the cross coupling section CC can be reduced, and thereby a threshold voltage difference ΔVth between the pair of MOSs becomes small. For this reason, a high-speed and stable sensing/amplifying operation can be performed.

An example of the operation shown in FIG. 11 will be described below with reference to FIG. 12. The operations performed from selection of a word line WL to reading of memory cell MC data after data line precharging is completed, are the same as the operations of the first and second embodiments. When read data is sensed and amplified, a sense amplifier activation signal SN is changed from a voltage VSS to a voltage VDL (or VPP or VDD), so that the voltage VSS is supplied from the N$^+$-type gate NMOS Qn2 of the sense driver SADN to the common source line CSN. At almost the same time, a sense amplifier activation signal SP1 is changed from the voltage VSS, to a value of voltage equal to or higher than a total voltage of the overdrive voltage VDD and the threshold voltage of an N$^+$-type gate NMOS Qn3, for example, to VPP, so that the overdrive voltage VDD is supplied from the NMOS Qn3 of an overdriver SADNP1 to a common source line CSP. The activation signal SP1 becomes the voltage VSS within time Δtp when the high-potential side of the data line does not exceed the data line swing voltage VDL, and an activation signal SP2 is changed into the voltage VPP in turn. In this manner, the data line swing voltage VDL is supplied from an N$^+$-type gate NMOS Qn4 of a restore driver SADP2 to the common source line CSP. The precharging operation can be similarly considered such that a signal obtained by inverting the sense amplifier activation signal SP of the above-mentioned first embodiment is used as the activation signal SP2.

In FIG. 11, since the overdriver SADP1 and the restore driver SADP2 serving as sense drivers are constituted by NMOSs, logic for activating the respective sense amplifier activation signals SP1 and SP2 are inverted from the activation signal in the first embodiment. These NMOSs may be NMOSs each having a small amount of channel implantation or NMOSs each having a normal amount of channel implantation. If the NMOSs each having the small amount of channel implantation are used, threshold voltages thereof decrease. In particular, in the overdriver SADP1, there are advantages of making the effect of overdrive more apparent, and of achieving a high-speed operation. Even though a transistor having the small amount of channel implantation is used, a gate-source voltage is a negative voltage in a standby state. For this reason, a leakage current is suppressed, and current consumption is not worth consideration. On the other hand, in the NMOS Qn2 of the sense driver SADN, since a gate-source voltage is 0 V in a standby state, a transistor having a normal amount of channel implantation is preferably used to reduce a subthreshold leakage current.

As a modification of this configuration, as shown in FIG. 13 as an example, a scheme is used in which the overdriver SADP1 is constituted by the P$^+$-type gate PMOS Qp3 of a PMOS. In this case, a configuration must be the same as the first embodiment in which the sense amplifier activation signal SP1 of FIG. 13 is inverted from that of FIG. 12. As the PMOS Qp3, a transistor having a normal amount of channel implantation is preferably used to reduce a leakage current in a standby state. In addition, in the same manner as described above, there is also a scheme in which the restore driver SADP2 is constituted by PMOSs. In this case, the sense amplifier activation signal SP2 must be a signal obtained by inverting the signal described in FIG. 12. As the transistor, a transistor having a normal amount of channel implantation is preferably used to reduce the leakage current in a standby state.

The sectional structure of this configuration will be described below. In the configuration of FIG. 3 which is the same as the above-mentioned first embodiment, since overdrive is performed, the substrate voltage VBP of the PMOS of the sense amplifier must be a value equal to or higher than the overdrive voltage VDD. In FIG. 3A, the substrate voltage of the NMOS is the voltage VBB which is equal to the voltage of a memory cell transistor, and the substrate voltage of the PMOS is the voltage VPP. For this reason, a configuration is adopted in which both the substrate voltages are applied. Therefore, there are advantages of increasing the threshold voltages of the PMOS and the NMOS, and of reducing a leakage current in a sense amplifier data holding state.

As described above, advantages of the configuration of the third embodiment are as follows. (1) Amplification can be performed at a high speed because of overdriving. (2) When transistors each having a small amount of channel implantation are used as the transistors of the cross coupling section CC, a deviation of threshold voltage can be reduced, and thereby a stable sensing/amplifying operation can be realized. In particular, deviations of threshold voltages of the PMOSs which are sharply activated at a high voltage can be reduced. (3) A low signal voltage obtained when bits of a low read signal voltage such as bits of a small capacity of a memory cell capacitor, or bits of a large leakage current in a memory cell transistor, or the like are selected can be accurately read, and fail bits can be reduced in number, and thereby the yield thereof is increased. (4) When either an NMOS or a PMOS having a normal amount of channel implantation is used in a driver for overdrive, a leakage current in a standby state can be reduced. (5) When a substrate bias voltage is applied to the transistors of the sense amplifier, the threshold voltages thereof increase and a leakage current in a sense amplifier data holding state can be suppressed.

(Modification of Third Embodiment)

In addition, as a modification of the third embodiment, a sectional structure shown in FIG. 3B can replace the sectional structure shown in FIG. 3A. In FIG. 3B, a substrate voltage VBN of an NMOS of a sense amplifier can have an arbitrary value. Advantages of this configuration are that, in addition to the advantages (1), (2), (3), and (4) of the third embodiment, the substrate voltage VBN of the NMOS of the sense amplifier is set to be a voltage VSS and thereby a high-speed operation can be performed.

As another modification of the third embodiment, a sectional structure shown in FIG. 3C may also be used. If a voltage of this case has a value equal to or higher than the substrate voltage VDD of the PMOS, it can have an arbitrary value. Advantages of this configuration are that, in addition to the advantages (1), (2), (3), and (4) of the third embodiment, the substrate voltage VBP of the PMOS of the sense amplifier is set to be the voltage VDD and thereby a high-speed operation is performed.

As still another modification of the third embodiment, a sectional structure shown in FIG. 3D may also be used. Advantages of this configuration are that, in addition to the advantages (1), (2), (3), and (4) of the third embodiment, the substrate voltage VBN of the NMOS of the sense amplifier and the substrate voltage VBP of the PMOS of the sense amplifier are set to be voltages VSS and VDD, respectively, and thereby a high-speed operation can be performed.

(Fourth Embodiment)

Figure 14:
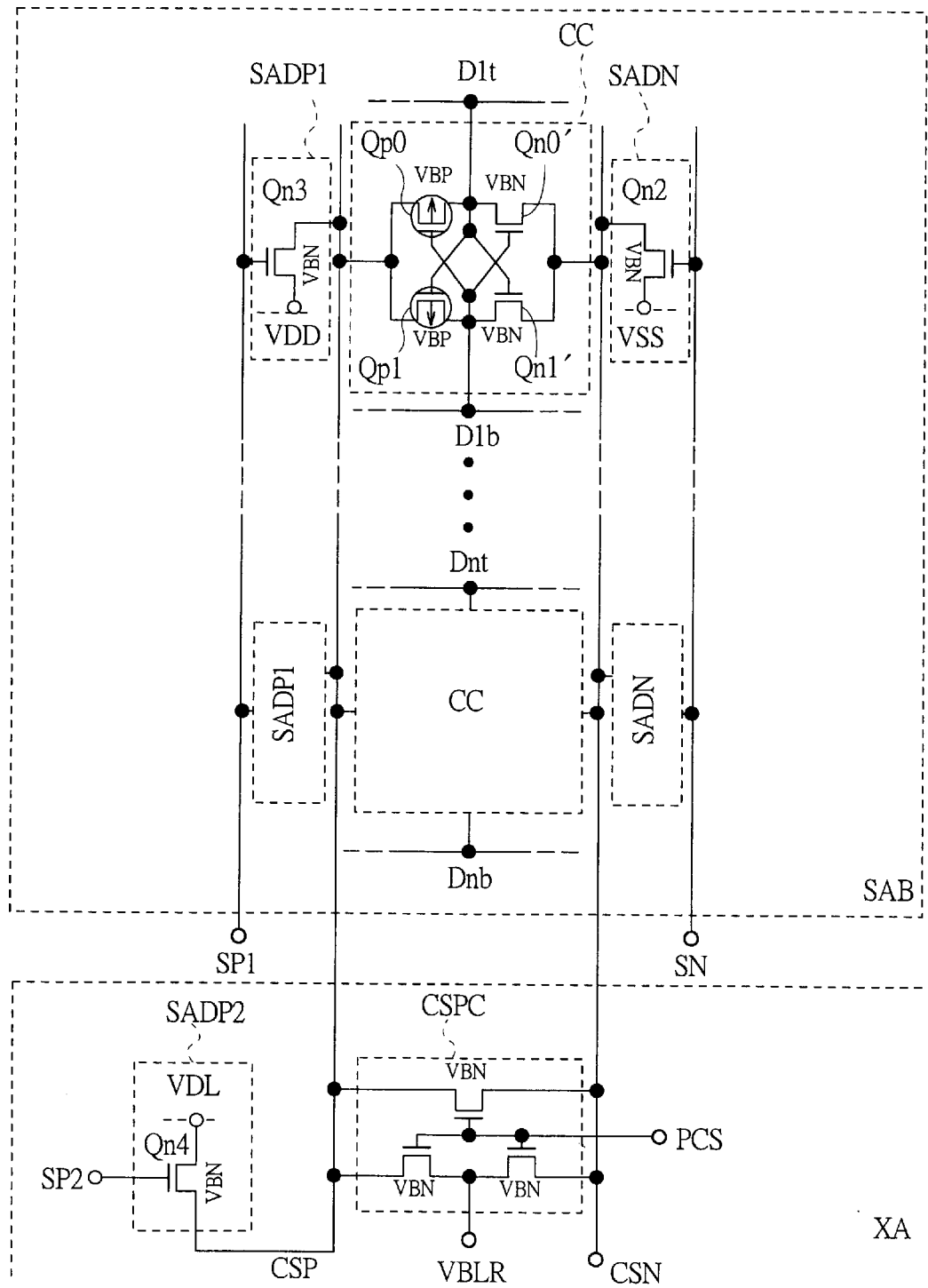
FIG. 14 is a circuit diagram showing a part of a sense amplifier according to a fourth embodiment to which the present invention is applied.

Next, a fourth embodiment will be described below with reference to FIG. 14. FIG. 14 is a circuit diagram showing a section of a sense amplifier according to a fourth embodiment to which the present invention is applied.

FIG. 14 shows only an example of a sense amplifier cross coupling section CC and common source lines CSP and CSN. Sections other than this configuration are the same as the sections shown in FIG. 4. This configuration adopts an overdrive scheme in which the sense amplifier is driven at an overdrive voltage VDD higher than a data line swing voltage VDL during a predetermined period Δtp of the sense beginning relative to the configuration of the sense amplifier of the second embodiment. Different points between the fourth embodiment and the third embodiment are as follows. That is, an overdriver SADP1 is arranged in a sense amplifier, and the overdriver SADP1 is constituted by an $N^+$-type gate NMOS Qn3 having a normal amount of channel implantation which is the same as the sense amplifier. In addition, a restore driver SADP2 is arranged at one end of the common source line, and an $N^+$-type gate NMOS Qn4 of the restore driver SADP2 is also constituted by an NMOS having a normal amount of channel implantation which is the same as the sense amplifier. The present embodiment is similar to the third embodiment, and drives the sense amplifier by the $N^+$-type gate NMOS Qn3 of the overdriver SADP1 at a voltage higher than the second embodiment, and thereby can be amplified at a high speed.

In addition, similarly to the second embodiment, when transistors each having a small amount of channel implantation are applied only to PMOSs Qp0 and Qp1, deviations of the threshold voltages of the PMOSs whose the deviations of threshold voltages are larger than those of the NMOSs can be reduced and the threshold voltage difference ΔVth between the pair of PMOSs (Qp0 and Qp1) of the cross coupling section CC can be reduced. In particular, since the PMOSs are sharply activated because of overdriving, the present invention becomes effective. Similarly to the second embodiment, in comparison with the first and third embodiments, the kinds of transistors for the NMOSs decrease in number. For this reason, there is an advantage of simplifying the steps of fabricating transistors.

In FIG. 14, each of the overdriver SADP1 and the restore driver SADP2 is constituted by NMOSs (Qn3 and Qn4). As a modification, even when any one or both of the overdriver SADP1 and the restore driver SADP2 are constituted by PMOSs, the same effects can be achieved. For example, when the over driver is constituted by the PMOSs, the logic of the sense amplifier activation signal SP1 shown in FIG. 14 must be inverted from the configuration shown in FIG. 12. At this time, it is desirable that each transistor having a normal amount of channel implantation are used as the PMOS to reduce a leakage current in a standby state. Even when the restore driver SADP2 is constituted by PMOSs, it is desirable that transistors each having a normal amount of channel implantation are used. An operation waveform chart corresponding to FIG. 14 is the same as FIG. 12 showing in the third embodiment.

Since overdrive is performed, the substrate voltages VBP of the PMOSs of the sense amplifier require being equal to or higher than the overdrive voltage VDD. In the sectional structure which is shown in FIG. 3A and which is the same as the above-mentioned first embodiment, the substrate voltage of the NMOS comes to a voltage VBB which is equal to a voltage of a memory cell transistor, and the substrate voltage of the PMOS comes to a voltage VPP. For this reason, a configuration is adopted in which both the substrate voltages are applied. Therefore, as the NMOS is a transistor having a normal amount of channel implantation, the threshold voltage of the NMOS is relatively high and an operation speed is low because a substrate bias voltage is applied. However, the threshold voltages of the PMOSs also increase due to a substrate bias effect, and there is such an advantage that a leakage current in a sense amplifier data holding state can be reduced.

As described above, advantages of the configuration of the fourth embodiment are as follows. (1) Amplification can be performed at a high speed by overdrive. (2) When transistors each having a small amount of channel implantation are used as the transistors of the cross coupling section CC, a deviation of threshold voltage thereof can be reduced, and thereby a stable sensing/amplifying operation can be realized. In particular, each deviation of threshold voltages of the PMOSs which are sharply activated at a high voltage can be reduced. (3) A low read signal voltage obtained when bits of a low read signal voltage such as bits of a small capacity of a memory cell capacitor, or bits of a large leakage current in a memory cell transistor, or the like are selected, can be accurately read, and thereby fail bits can be reduced in number and the yield thereof is improved. (4) When an NMOS or a PMOS which has a normal amount of channel implantation is used in a driver for overdrive, a leakage current in a standby state can be reduced. (5) When a substrate bias voltage is applied to the transistors of the sense amplifier, each threshold voltage thereof increases, and a leakage current in a sense amplifier data holding state can be suppressed. (6) A mask for channel implantation becomes unnecessary in an NMOS, and the process steps can be simplified in comparison with the above-mentioned first embodiment. The other effects of the fourth embodiment are the same as the effects of the first embodiment.

(Modification of Fourth Embodiment)

In addition, as a modification of a fourth embodiment, a sectional structure shown in FIG. 3B can also replace the sectional structure shown in FIG. 3A. Since the NMOSs of the cross coupling section CC are transistors each having a normal amount of channel implantation, threshold voltages thereof are relatively high. However, since each substrate voltage VBN of the NMOSs can be set to be an arbitrary value, the threshold voltages thereof can be prevented from being increased due to a substrate bias effect if each substrate voltage VBN is set to be at VSS. Therefore, a high-speed operation can be performed. This configuration has such advantages that, in addition to the advantages (1), (2), (3), (4), and (6) of the fourth embodiment, the substrate voltages VBN of the NMOSs of the sense amplifier is set to be the voltages VSS and thereby a high-speed operation can be performed.

As another modification of the fourth embodiment, the sectional structure shown in FIG. 3C may also be used. In this modification, a substrate voltage of a PMOS can be set to be an arbitrary voltage. However, When a substrate voltage VBP of the PMOS is set to be a voltage VDD, a high-speed operation can be realized. On the other hand, since a substrate bias voltage is applied even in a data holding state, a leakage current can be reduced. As described above, this configuration has such advantages that, in addition to the advantages (1), (2), (3), (4), and (6) of the fourth embodiment, each substrate voltage VBP of the PMOSs of the sense amplifier is set to be the voltage VDD and thereby a high-speed operation can be performed.

As still another modification of the fourth embodiment, the sectional structure shown in FIG. 3D may also be used. This configuration has such advantages that, in addition to the advantages (1), (2), (3), (4), and (6) of the fourth embodiment, each substrate voltage VBN of the NMOSs of a sense amplifier and each substrate voltage VBP of the PMOSs of the sense amplifier are set to be voltages VSS and VDD, respectively, and thereby a high-speed operation can be performed.

An example of each value of voltages of the above-mentioned first, second, third, and fourth embodiments will be described below. When a data line high-potential-side voltage VDL becomes 1.5 V or less, a signal voltage being read by a data line falls within the range of about 100 mV to 200 mV and becomes 100 mV or less by the configuration of the memory array. For this reason, the present invention is effective to stabilize the operation thereof. In addition, in a data line small-swing memory array having the power consumption of which is low, e.g., VDL=1.2 V, since a read signal voltage further decreases, an effect larger than the effects described above is achieved. A word line boost level VPP is appropriately set to be a voltage obtained by adding a threshold voltage of the transistor of a memory cell MC and a current drive voltage to the data line high-potential-side voltage VDL, i.e., to be about VDL+1.7 V. Further, when an overdrive voltage VDD is directly connected to an external voltage VCC, a high-speed sense amplifier operation can be performed even though the data line amplitude is a low voltage of 1.5 V or less.

A process region in which the present invention is specially effective is a region in which, relative to ½ (called a minimum processing size F herein) of a small one out of a data line pitch and a word line pitch, it is easily that the processing size F is used in the cross coupling section CC, or a region of such super-micro fabrication that the minimum processing size F which becomes relatively large in a gate processing deviation is 0.15 $\mu$m or less, or a region of such a processing size that a phase-shift lithography having a gate processing deviation due to phase shift is used in photolithography.

With respect to an impurity density obtained by channel implantation, impurity densities of channels of an NMOS and a PMOS each having a transistor with a normal amount of channel implantation are about $1 \times 10^{18}$ cm$^{-3}$, and impurity densities of transistors each having a small amount of channel implantation are half of an impurity density of the transistor having a normal amount of channel implantation, so that a reduction effect can be achieved. In addition, when the impurity density is the level of about $10^{16}$ cm$^{-3}$ whose a value is 1/10 or less relative thereto. In this case, since the threshold voltages decrease, substrate voltages are desirably applied.

(Fifth Embodiment)

Figure 15:
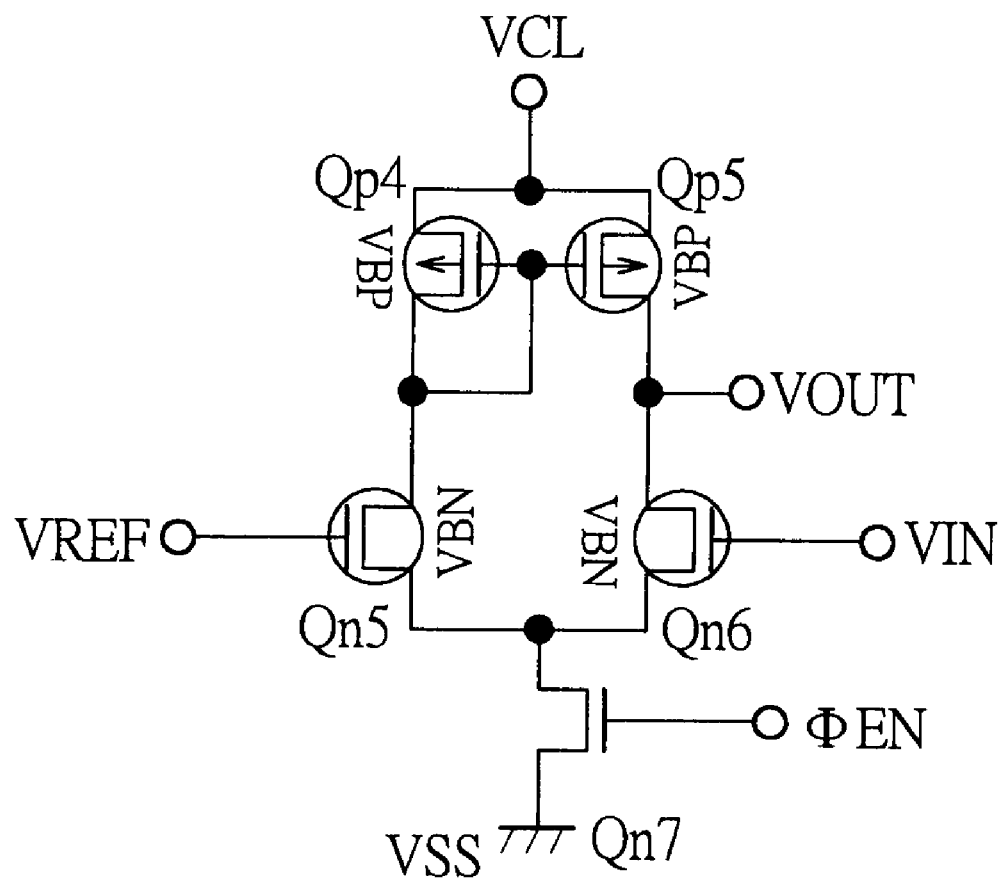
FIG. 15 is a circuit diagram showing a differential amplifier to which the present invention is applied.
Figure 16A:
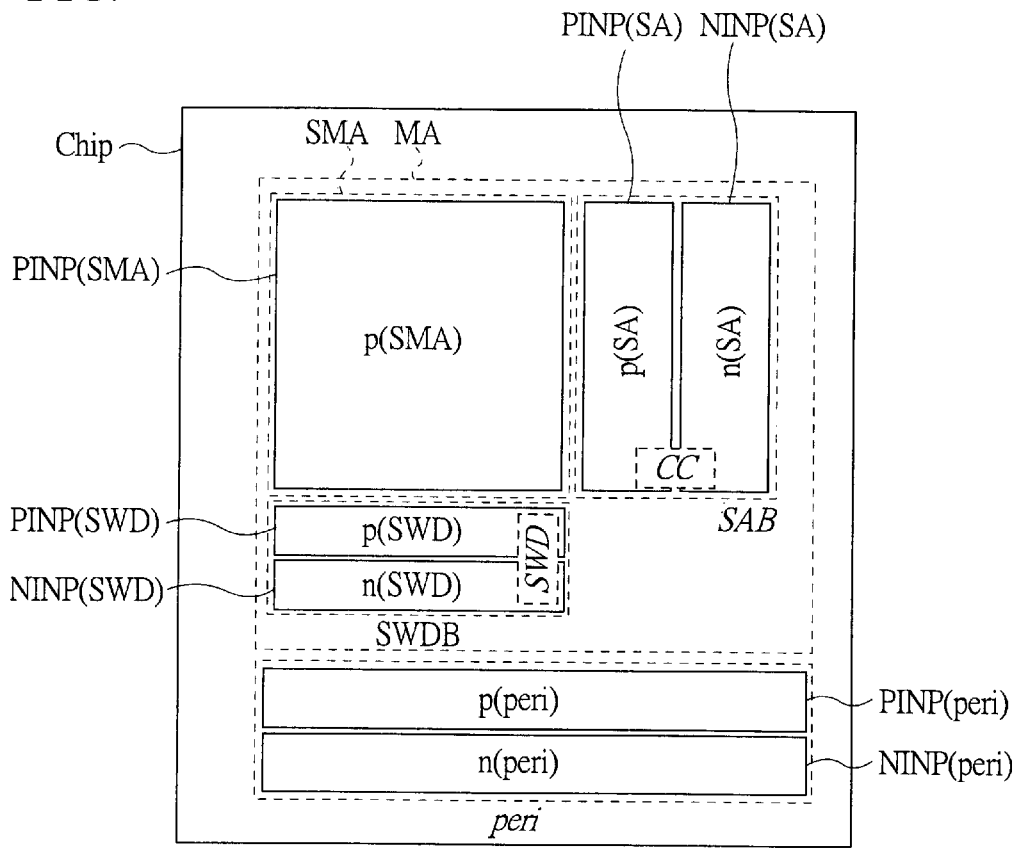
FIG. 16A is a layout diagram showing a transistor channel region and a sense amplifier of a DRAM which has been considered on the assumption that the present invention is made.
Figure 16B:
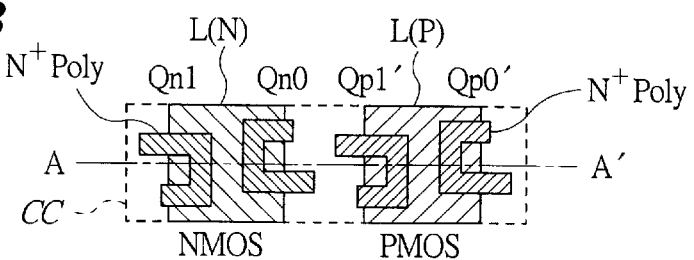
FIG. 16B is a layout diagram of a sense amplifier cross coupling section.
Figure 16C:
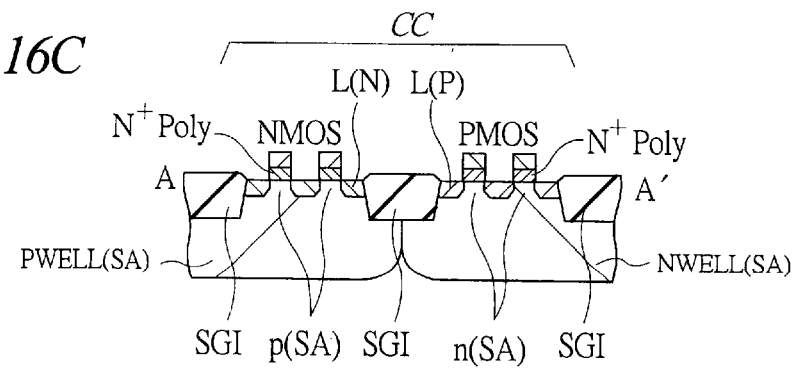
FIG. 16C is a cross-sectional view showing a sense amplifier cross coupling section.
Figure 17:
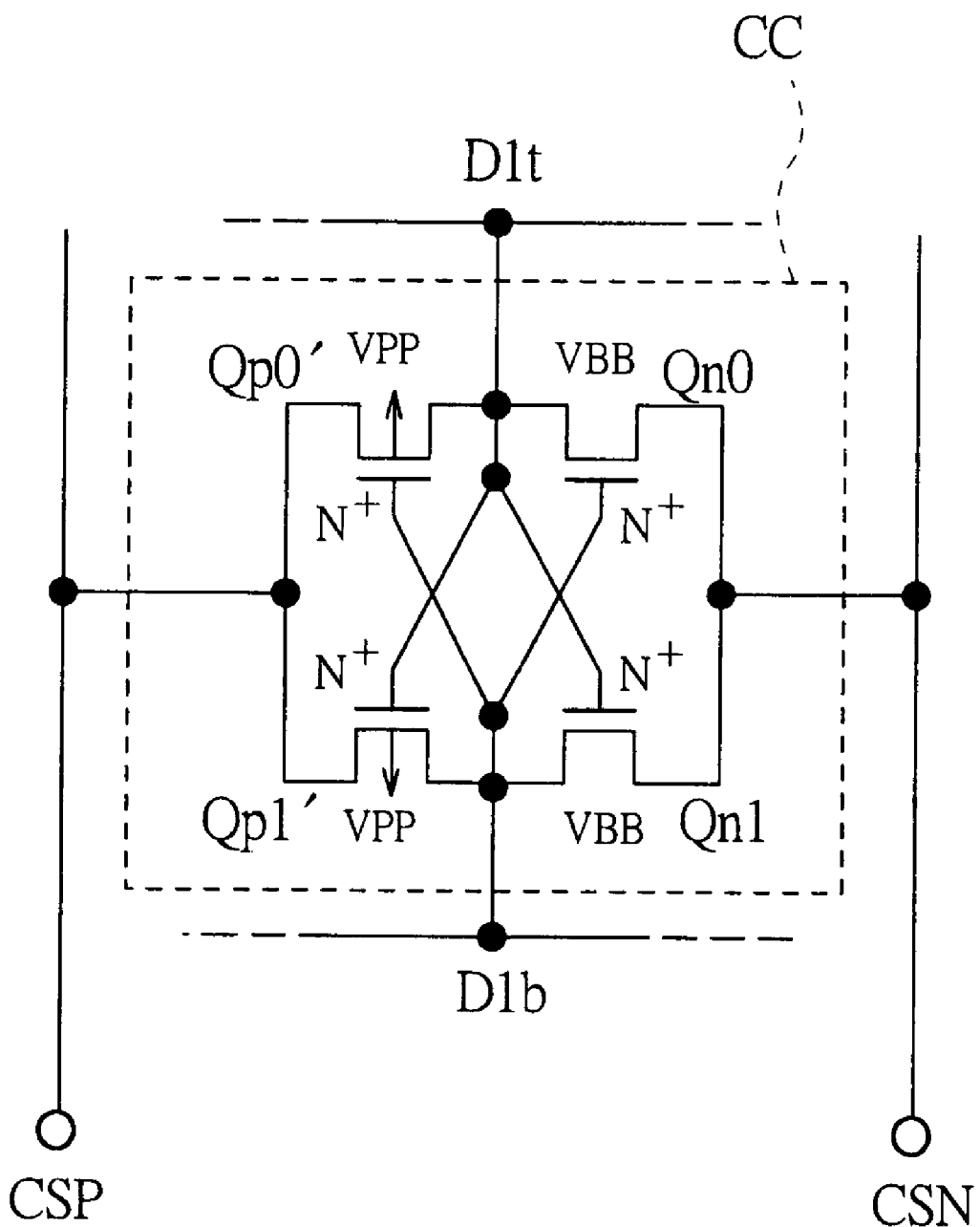
FIG. 17 is a circuit diagram showing a part of a sense amplifier which has been considered on the assumption that the present invention is made.

An example in which the present invention is applied to a differential amplifier of still another semiconductor device is shown in FIG. 15 as a fifth embodiment. FIG. 15 is a circuit diagram showing a differential amplifier to which the present invention is applied.

A differential amplifier that is an example is shown in FIG. 15 is a circuit which outputs inverted data to an input signal VIN by using a reference voltage VREF as a reference potential and which is often used in a section for deciding a signal such as an address or a command or the like being input from the outside. Reference symbol ΦEn denotes a signal for activating an amplifier circuit. Reference symbol VOUT denotes an output signal. If there is the threshold voltage difference between P$^+$-type gate PMOSs Qp4 and Qp5 of the PMOSs, left and right loads are unbalanced and thereby each operation of the PMOSs corresponding to a differential operation section is affected. If there is the threshold voltage difference between N$^+$-type gate NMOSs Qn5 and Qn6 of the NMOSs, an erroneous operation may occur in a decision processing of an input signal. Further, if the erroneous operation does not occur and if there are deviations of the threshold voltages between a plurality of differential amplifiers, then operation speeds between the differential amplifiers deviate. Timing margins for an input signal require being large, and thereby there arises a problem of decrease in operational margins.

Thereupon, the present invention applies transistors each having a small amount of channel implantation to these transistors and thereby reduce the deviations of threshold voltages and the threshold voltage difference between the pair of MOSs. In addition, the threshold voltages become lower by using the transistors each having a small channel implantation. Therefore, if each substrate voltage VBP of the PMOSs (Qp4 and Qp5) is set to be a voltage VCL or more, e.g., an external voltage VCC or if a DRAM is used, then each substrate voltage VBP is set to be a word line boost voltage VPP. If each substrate voltage VBN of the NMOSs (Qn5 and Qn6) is set to be a voltage VSS or less, e.g., if a DRAM is used, then each substrate voltage VBP is set to be a transistor substrate voltage VBB of a memory cell MC. Accordingly, the threshold voltages are increased by a substrate bias effect, and a subthreshold leak current at a data output can be reduced, and a low power consumption can be achieved. For this reason, deviations of threshold voltages are reduced, and the deviations of operation speeds between the differential amplifiers and the threshold voltage difference between the pair of MOSs are reduced, and so a stable operation and a low power consumption can be realized.

As described above, the invention made by the present inventors has been concretely described on the basis of the embodiments thereof. However, the present invention is not limited to the embodiments described above, and, needless to say, various changes and modifications can be made without departing from the spirit of the invention.

For example, the present invention is not limited only to the sense amplifier sections described in the first, second, third, and fourth embodiments and to the differential amplifier described in the fifth embodiment. By using the present invention even in another differential amplifier or a CMOS inverter circuit used on a delay stage, a stable operation and a deviation of operation thereof can be realized due to reduction of a deviation of threshold voltage thereof.

Typical examples of the present invention are as follows.

(1) A semiconductor device including a plurality of memory cells provided at intersecting points of a plurality of word lines and a plurality of data lines; a plurality of sense amplifiers provided so as to each correspond to said plurality of data lines and having a first MISFET pair of a first conductivity type, the first MISFET pair using a cross-coupled P-type polysilicon layer as a gate electrode; and a decoder circuit having a second MISFET of said first conductivity type, the second MISFET selecting any one of said memory cells and using a P-type polysilicon layer as a gate electrode, is characterized in that an impurity density of channel of said first MISFET pair is lower than that of said second MISFET.

(2) The semiconductor device according to item (1), wherein each of said sense amplifiers amplifies a signal of a corresponding data line to a first potential of a low-potential side or a second potential of a high-potential side, and wherein a third potential which is a substrate potential of said first MISFET pair is a potential which is higher than said second potential.

(3) The semiconductor device according to item (1), wherein each of said sense amplifiers further has a third MISFET pair of a second conductivity type, the third MISFET pair using a cross-coupled N-type polysilicon layer as a gate electrode, and wherein said decoder circuit further has a fourth MISFET of said second conductivity type, the fourth MISFET using an N-type polysilicon layer as a gate electrode, and wherein an impurity density of channel of said third MISFET pair is lower than that of said fourth MISFET.

(4) The semiconductor device according to item (3), wherein each of said sense amplifiers amplifies a signal of a corresponding data line to a first potential of a low-potential side or a second potential of a high-potential side, and wherein a third potential which is a substrate potential of said first MISFET pair is a potential which is higher than said second potential.

(5) The semiconductor device according to item (3), wherein each of said sense amplifiers amplifies a signal of a corresponding data line to a first potential of a low-potential side or a second potential of a high-potential side, and wherein a fourth potential which is a substrate potential of said third MISFET pair is a potential which is lower than said first potential.

(6) The semiconductor device according to item (5), wherein said fourth potential is equal to a substrate potential of a fifth MISFET constituting said memory cells.

(7) The semiconductor device according to item (3), wherein a second region of an N conductivity type is arranged below a first region of a P conductivity type which is a substrate region of said plurality of memory cells, and wherein a third region which is a substrate region of said first MISFET pair is electrically connected to said second region, and wherein a fourth region which is a substrate region of said third MISFET pair is electrically connected to said first region.

(8) The semiconductor device according to item (1), wherein each of said sense amplifiers amplifies a signal of a corresponding data line to a first potential of a low-potential side or a second potential of a high-potential side, and wherein said semiconductor device further has a sixth MISFET of said first conductivity type, the sixth MISFET using, as a gate electrode, a P-type polysilicon layer f or supplying said second potential to said sense amplifiers, and wherein an impurity density of channel of said sixth MISFET is higher than that of said first MISFET pair.

(9) The semiconductor device according to item (8), wherein said word line extends in a first direction, and wherein said data line extends in a second direction which crosses said first direction, and wherein said plural sixth MISFET is arranged in parallel to said plurality of sense amplifiers extending in said first direction.

(10) The semiconductor device according to item (8), wherein said semiconductor device further has a seventh MISFET of said first conductivity type, the seventh MISFET using, as a gate electrode, a P-type polysilicon layer for supplying a fifth potential higher than said second potential to said sense amplifiers, and wherein an impurity density of channel of said seventh MISFET is higher than that of said first MISFET pair.

(11) The semiconductor device according to item (10), wherein said word line extends in a first direction, and wherein said data line extends in a second direction which crosses said first direction, and wherein said plural seventh MISFET is arranged in parallel to said plurality of sense amplifiers extending in said first direction.

(12) The semiconductor device according to item (3), wherein each of said sense amplifiers amplifies a signal of a corresponding data line to a first potential of a low-potential side or a second potential of a high-potential side, and wherein said semiconductor device further has an eighth MISFET of said second conductivity type, the eighth MISFET using, as a gate electrode, an N-type polysilicon layer for supplying said second potential to said sense amplifiers, and wherein an impurity density of channel of said eighth MISFET is higher than that of said third MISFET pair.

(13) The semiconductor device according to item (12), wherein said word line extends in a first direction, and wherein said data line extends in a second direction which crosses said first direction, and wherein said plural eighth MISFET is arranged in parallel to said plurality of sense amplifiers extending in said first direction.

(14) The semiconductor device according to item (12), wherein said semiconductor device further has a ninth MISFET of said second conductivity type, the ninth MISFET using, as a gate electrode, an N-type polysilicon layer for supplying a fifth potential higher than said second potential to said sense amplifiers, and wherein an impurity density of channel of said ninth MISFET is higher than that of said first MISFET pair.

(15) The semiconductor device according to item (14), wherein said word line extends in a first direction, and wherein said data line extends in a second direction which crosses said first direction, and wherein said plural ninth MISFET is arranged in parallel to said plurality of sense amplifiers extending in said first direction.

(16) The semiconductor device according to item (10), wherein said semiconductor device further has a first region of a P conductivity type serving as a substrate region of said memory cells and a second region of an N conductivity type, the second region being formed below said first region, and wherein said seventh MISFET is formed in a region of a P conductivity type which is adjacent to and is electrically connected to said first region on said second region.

(17) The semiconductor device according to item(3), wherein each of said sense amplifiers amplifies a signal of a corresponding data line to a first potential of a low-potential side or a second potential of a high-potential side, and wherein said semiconductor device further has a tenth MISFET of the second conductivity type, the tenth MISFET using, as a gate electrode, an N-type polysilicon layer for supplying said first potential to said sense amplifiers, and wherein an impurity density of channel of said tenth MISFET is higher than that of said third MISFET pair.

(18) The semiconductor device according to item (17), wherein said word line extends in a first direction, and wherein said data line extends in a second direction which crosses said first direction, and wherein said plural tenth MISFET is arranged in parallel to said plurality of sense amplifiers extending in said first direction.

(19) The semiconductor device according to item (1), wherein the impurity density of channel of said first MISFET pair is half of or less than that of said second MISFET pair.

(20) The semiconductor device according to item (1), wherein the impurity densities of channel of said first MISFET pair is $2.0 \times 10^{17}$ cm$^{-3}$ or less.

(21) The semiconductor device according to item (3), wherein the impurity density of channel of said third MISFET pair is half of or less than that of said fourth MISFET.

(22) The semiconductor device according to item (3), wherein the impurity density of channel of said third MISFET pair is $2.0 \times 10^{17}$ cm$^{-3}$ or less.

(23) The semiconductor device according to item (1), wherein each of said sense amplifiers amplifies a signal of a corresponding data line to a first potential of a low-potential side or a second potential of a high-potential side, and wherein said second potential is 1.6 V or less.

(24) A semiconductor device comprising a circuit that includes a first MISFET of a first conductivity type in which a substrate potential is used as a first potential and which uses a P-type polysilicon layer as a gate electrode, and a second MISFET of a second conductivity type in which a second potential is used as a substrate potential and which uses an N-type polysilicon layer as a gate electrode; third and fourth MISFETs of said first conductivity type which use P-type polysilicon layers as gate electrodes and whose the gate electrodes are connected to any one of drain terminals thereof and whose source terminals are common to each other; a fifth MISFET of said second conductivity type which uses an N-type polysilicon layer as a gate electrode and the gate electrode of which a first signal is input into and a drain terminal of which is connected to a drain terminal of said third MISFET; and a sixth MISFET of said second conductivity type which use an N-type polysilicon layer as a gate electrode and the gate electrode of which a second signal is input into and a source terminal whose is commonly connected to said fifth MISFET, is characterized in that each impurity density of channels of said fifth MISFET and said sixth MISFET is lower than that channel of the first MISFET, and that each substrate potential of said fifth MISFET and said sixth MISFET is lower than said second potential.

(25) The semiconductor device according to item (24), wherein each impurity density of channels of said third MISFET and said fourth MISFET is lower than the impurity density of channel of said first MISFET, and wherein each substrate potential of said third MISFET and said fourth MISFET is higher than said first potential.

(26) The semiconductor device according to item (24) or (25), wherein said first signal has a potential which is lower than said first potential and higher than said second potential.

Of the inventions disclosed in the present application, effects obtained by the typical ones will be briefly described below.

(1) In the first embodiment, each deviation of threshold voltages of both an NMOS and a PMOS is reduced to realize a stable sensing/amplifying operation in a sense amplifier. More specifically, by using, in a sense amplifier, transistors each having a reduced amount of channel implantation in a sense amplifier, each deviation of threshold voltage that decreases an effective signal voltage is reduced. In this manner, even when data having a small signal voltage is read, a reliable sensing/amplifying operation can be performed in the sense amplifier without reducing an effective signal voltage. In addition, in reduction in threshold voltage performed by a small amount of channel implantation, each threshold voltage is compensated by applying a substrate voltage, and a leakage current is reduced, and so power consumption in a sense amplifier data holding state can be reduced.

(2) In the second embodiment, in comparison with the first embodiment, although an effect of reducing deviations of threshold voltages of the NMOSs is not be obtained, the present invention is effectively applied to the PMOSs having a large deviation of threshold voltage.

(3) As described in the third and fourth embodiments, when the present invention is used together with an overdrive scheme, a high-speed sensing operation at a low voltage can be realized. By using transistors each having a normal amount of channel implantation in a sense amplifier, a leakage current in a standby state can be reduced, and thereby a low power consumption can be realized.

What is claimed is:

1. A semiconductor device comprising:

a plurality of memory cells arranged at intersecting points of a plurality of word lines and a plurality of data lines;

a plurality of sense amplifiers provided so as to each correspond to said plurality of data lines and having a first MISFET pair of a first conductivity type which uses a cross-coupled P-type polysilicon layer as a gate electrode; and a decoder circuit having a second MISFET of said first conductivity type which uses a P-type polysilicon layer as a gate electrode and which selects any one of said memory cells, wherein an impurity density of channel of said first MISFET pair is lower than that of said second MISFET.

2. The semiconductor device according to claim 1, wherein each of said sense amplifiers amplifies a signal of a corresponding data line to one of a first potential of a low-potential side and a second potential of a high-potential side, and wherein a third potential which is a substrate potential of said first MISFET pair is a potential which is higher than said second potential.

3. The semiconductor device according to claim 1, wherein each of said sense amplifiers further has a third MISFET pair of a second conductivity type which uses a cross-coupled N-type polysilicon layer as a gate electrode, wherein said decoder circuit further has a fourth MISFET of said second conductivity type which uses an N-type polysilicon layer as a gate electrode, and wherein an impurity density of channel of said third MISFET pair is lower than that of said fourth MISFET.

4. The semiconductor device according to claim 3, wherein each of said sense amplifiers amplifies a signal of a corresponding data line to one of a first potential of a low-potential side and a second potential of a high-potential side, and wherein a third potential which is a substrate potential of said first MISFET pair is a potential that is higher than said second potential.

5. The semiconductor device according to claim 3, wherein each of said sense amplifiers amplifies a signal of a corresponding data line to one of a first potential of a low-potential side and a second potential of a high-potential side, and wherein a fourth potential which is a substrate potential of said third MISFET pair is a potential that is lower than said first potential.

6. The semiconductor device according to claim 5, wherein said fourth potential is equal to a substrate potential of a fifth MISFET constituting said memory cells.

7. The semiconductor device according to claim 3, wherein a second region of an N conductivity type is arranged below a first region of a P conductivity type which is a substrate region of said plurality of memory cells, wherein a third region which is a substrate region of said first MISFET pair is electrically connected to said second region, and wherein a fourth region which is a substrate region of said third MISFET pair is electrically connected to said first region.

8. The semiconductor device according to claim 3,
wherein each of said sense amplifiers amplifies a signal of a corresponding data line to one of a first potential of a low-potential side and a second potential of a high-potential side,
wherein said semiconductor device further has an eighth MISFET of said second conductivity type which uses, as a gate electrode, an N-type polysilicon layer for supplying said second potential to said sense amplifiers, and
wherein an impurity density of channel of said eighth MISFET is higher than that of said third MISFET pair.

9. The semiconductor device according to claim 8,
wherein said word line extends in a first direction,
wherein said data line extends in a second direction which crosses said first direction, and
wherein said plural eighth MISFET is arranged in parallel to said plurality of sense amplifiers extending in said first direction.

10. The semiconductor device according to claim 8
wherein said semiconductor device further has a ninth MISFET of the second conductivity type which uses, as a gate electrode, an N-type polysilicon layer for supplying a fifth potential higher than said second potential to said sense amplifiers, and
wherein an impurity density of channel of said ninth MISFET is higher than that of said first MISFET pair.

11. The semiconductor device according to claim 10,
wherein said word line extends in a first direction,
wherein said data line extends in a second direction which crosses said first direction, and
wherein said plural ninth MISFET is arranged in parallel to said plurality of sense amplifiers extending in said first direction.

12. The semiconductor device according to claim 3,
wherein each of said sense amplifiers amplifies a signal of a corresponding data line to one of a first potential of a low-potential side and a second potential of a high-potential side,
wherein said semiconductor device further has a tenth MISFET of said second conductivity type which uses, as a gate electrode, an N-type polysilicon layer for supplying said first potential to said sense amplifiers, and
wherein an impurity density of channel of said tenth MISFET is higher than that of said third MISFET pair.

13. The semiconductor device according to claim 12,
wherein said word line extends in a first direction,
wherein said data line extends in a second direction which crosses said first direction, and
wherein said plural tenth MISFET is arranged in parallel to said plurality of sense amplifiers extending in said first direction.

14. The semiconductor device according to claim 1,
wherein each of said sense amplifiers amplifies a signal of a corresponding data line to one of a first potential of a low-potential side and a second potential of a high-potential side,
wherein said semiconductor device further has a sixth MISFET of said first conductivity type which uses, as a gate electrode, a P-type polysilicon layer for supplying said second potential to said sense amplifiers, and
wherein an impurity density of channel of said sixth MISFET is higher than that of said first MISFET pair.

15. The semiconductor device according to claim 14,
wherein said word line extends in a first direction,
wherein said data line extends in a second direction which crosses said first direction, and
wherein said plural sixth MISFET is arranged in parallel to said plurality of sense amplifiers extending in said first direction.

16. The semiconductor device according to claim 8,
wherein said semiconductor device further has a seventh MISFET of said first conductivity type which uses, as a gate electrode, a P-type polysilicon layer for supplying a fifth potential higher than said second potential to said sense amplifiers, and
wherein an impurity density of channel of said seventh MISFET is higher than that of said first MISFET pair.

17. The semiconductor device according to claim 16,
wherein said word line extends in a first direction,
wherein said data line extends in a second direction which crosses said first direction, and
wherein said plural seventh MISFET is arranged in parallel to said plurality of sense amplifiers extending in said first direction.

18. The semiconductor device according to claim 16,
wherein said semiconductor device further has a first region of a P conductivity type which is a substrate region of said memory cells and a second region of an N conductivity type which is disposed below the first region, and
wherein said seventh MISFET is formed in a region of a P conductivity type being which is adjacent to and is electrically connected to said first region on said second region.

19. A semiconductor device comprising a circuit that includes a first MISFET of a first conductivity type in which a substrate potential is used as a first potential and which uses a P-type polysilicon layer as a gate electrode, and a second MISFET of a second conductivity type in which a second potential is used as a substrate potential and which uses an N-type polysilicon layer as a gate electrode; a third and fourth MISFETs of said first conductivity type which use P-type polysilicon layers as gate electrodes and whose the gate electrodes are connected to any one of drain terminals thereof and whose source terminals are common to each other; a fifth MISFET of said second conductivity type which uses an N-type polysilicon layer as a gate electrode and the gate electrode of which a first signal is input into and a drain terminal of which is connected to a drain terminal of said third MISFET; and a sixth MISFET of said second conductivity type which use an N-type polysilicon layer as a gate electrode and the gate electrode of which a second signal is input into and a source terminal whose is commonly connected to said fifth MISFET,
wherein each impurity density of channels of said fifth MISFET and said sixth MISFET is lower than that channel of the first MISFET, and
wherein each substrate potential of said fifth MISFET and said sixth MISFET is lower than said second potential.

20. The semiconductor device according to claim 19,
wherein each impurity density of channels of said third MISFET and said fourth MISFET is lower than the impurity density of channel of said first MISFET, and
wherein each substrate potential of said third MISFET and said fourth MISFET is higher than said first potential.

* * * * *